(12) United States Patent  (10) Patent No.: US 6,629,553 B2
Odashima et al.  (45) Date of Patent: Oct. 7, 2003

(54) METHOD AND SYSTEM FOR MOUNTING SEMICONDUCTOR DEVICE, SEMICONDUCTOR DEVICE SEPARATING SYSTEM, AND METHOD FOR FABRICATING IC CARD

(75) Inventors: Hitoshi Odashima, Yokohama (JP); Kazuyuki Futagi, Yokohama (JP); Makoto Matsuoka, Hadano (JP); Toshimitsu Nakagawa, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/984,567

(22) Filed: Oct. 30, 2001

(65) Prior Publication Data

US 2002/0072202 A1 Jun. 13, 2002

Related U.S. Application Data

(63) Continuation of application No. 09/145,221, filed on Sep. 1, 1998, now abandoned.

(30) Foreign Application Priority Data

Sep. 4, 1997 (JP) .............................................. 9-239924

(51) Int. Cl.[7] .............................................. B32B 35/00
(52) U.S. Cl. ........................ 156/584; 156/344; 438/464; 438/976
(58) Field of Search ................................ 156/344, 584; 438/464, 976

(56) References Cited

U.S. PATENT DOCUMENTS

| 3,497,948 | A | * | 3/1970 | Wiesler et al. .............. 156/257 |
| 3,785,895 | A | | 1/1974 | Ettre et al. |
| 4,732,642 | A | | 3/1988 | Ametani |
| 4,798,645 | A | * | 1/1989 | Pak .............................. 156/344 |
| 4,915,565 | A | * | 4/1990 | Bond et al. .................. 156/567 |
| 4,990,051 | A | | 2/1991 | Safabakhsh et al. |
| 5,238,876 | A | | 8/1993 | Takeuchi et al. |
| 5,291,371 | A | | 3/1994 | Guber et al. |
| 5,332,406 | A | * | 7/1994 | Takeuchi et al. ............... 225/2 |
| 5,482,899 | A | * | 1/1996 | McKenna et al. .......... 156/344 |
| 5,545,282 | A | * | 8/1996 | Bechmann ................... 156/248 |
| 5,575,136 | A | | 11/1996 | Caldwell et al. |
| 5,593,926 | A | | 1/1997 | Fujihira |
| 5,605,844 | A | | 2/1997 | Oki et al. |
| 5,671,530 | A | * | 9/1997 | Combs et al. ............. 29/426.3 |

(List continued on next page.)

FOREIGN PATENT DOCUMENTS

| DE | 295 049 A5 | 10/1991 | |
| JP | 52-27352 | * 3/1977 | .................. 156/584 |
| JP | 63-29946 | * 2/1988 | .................. 156/344 |
| JP | 1-264236 | 10/1989 | |
| JP | 2-026044 | 1/1990 | |
| JP | 6-349934 | 6/1993 | |
| JP | 6-97214 | 4/1994 | |
| JP | 6-295930 | 10/1994 | |
| JP | 9-167779 | 6/1997 | |
| JP | 9-181150 | 7/1997 | |

*Primary Examiner*—Mark A. Osele
(74) *Attorney, Agent, or Firm*—Antonelli, Terry, Stout & Kraus, LLP

(57) ABSTRACT

A semiconductor device mounting method and system and an IC card fabricating method which can fabricate high quality products by dicing a thin semiconductor wafer, in a state where it is adhered to an adhesive sheet, into thin semiconductor devices, peeling the group of diced thin semiconductor devices from the adhesive sheet at high speed without damaging or cracking the semiconductor devices, conveying the group of peeled semiconductor devices on a unit basis in serial order, and mounting them onto a mounting board.

2 Claims, 30 Drawing Sheets

U.S. PATENT DOCUMENTS

| | | | |
|---|---|---|---|
| 5,888,883 A | | 3/1999 | Sasaki et al. |
| 5,911,850 A | * | 6/1999 | Zung .......................... 156/344 |
| 5,960,260 A | | 9/1999 | Umehara et al. |
| 5,994,205 A | | 11/1999 | Yamamoto et al. |
| 6,025,251 A | | 2/2000 | Jakowetz et al. |
| 6,039,833 A | | 3/2000 | Freund et al. |
| 6,123,800 A | * | 9/2000 | Freund et al. ............... 156/344 |
| 6,149,758 A | * | 11/2000 | Tsujimoto et al. ........... 156/247 |
| 6,290,805 B1 | * | 9/2001 | Freund et al. ............... 156/344 |

* cited by examiner

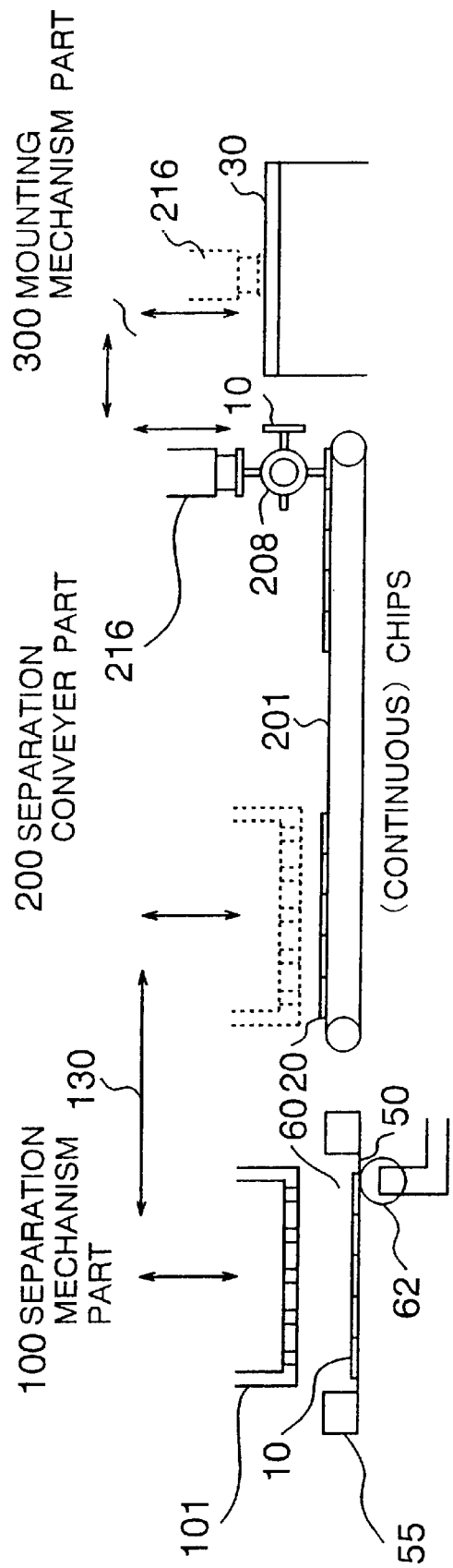

UV IRRADIATION

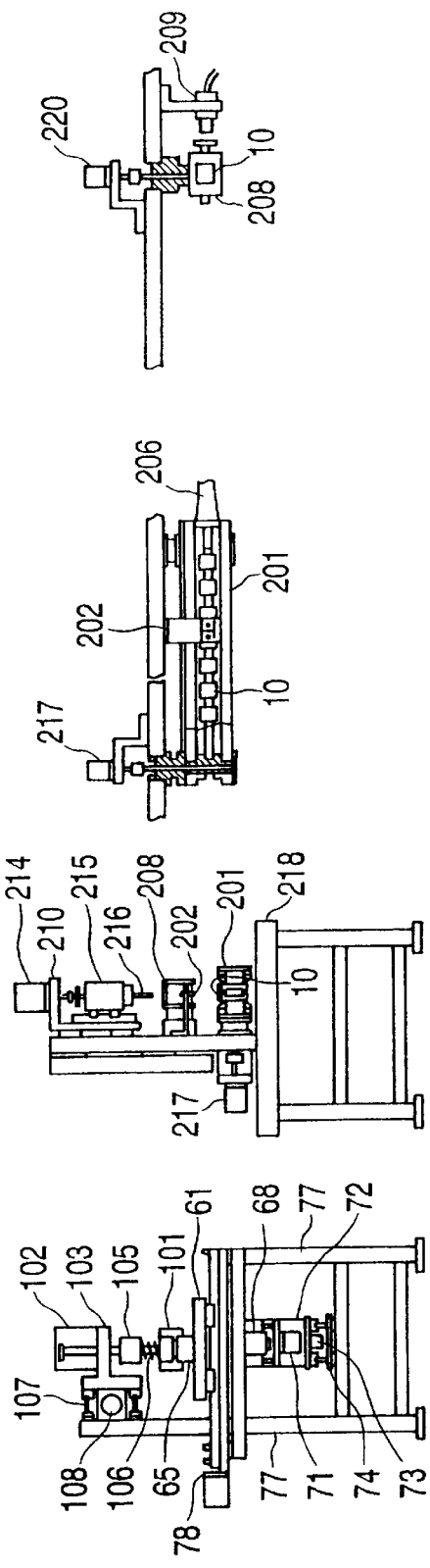

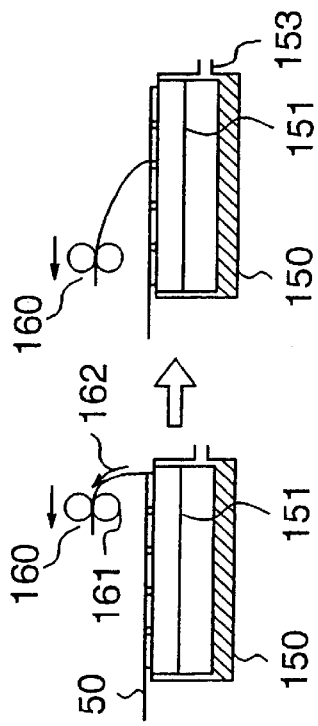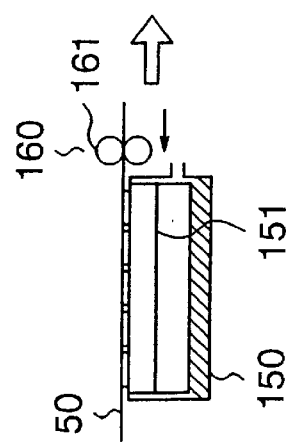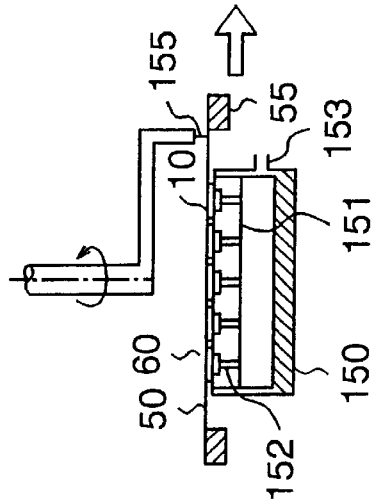
FIG. 19A  FIG. 19B  FIG. 19C  FIG. 19D

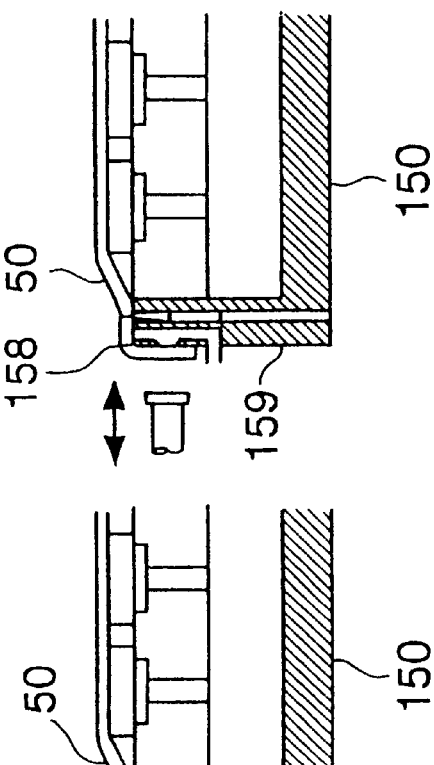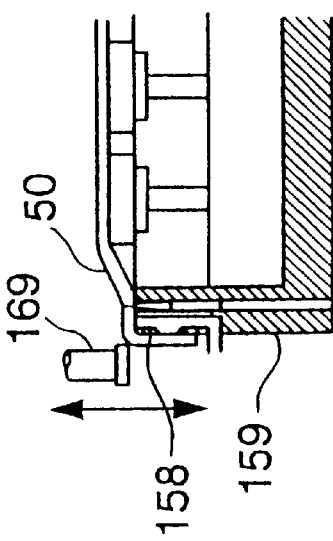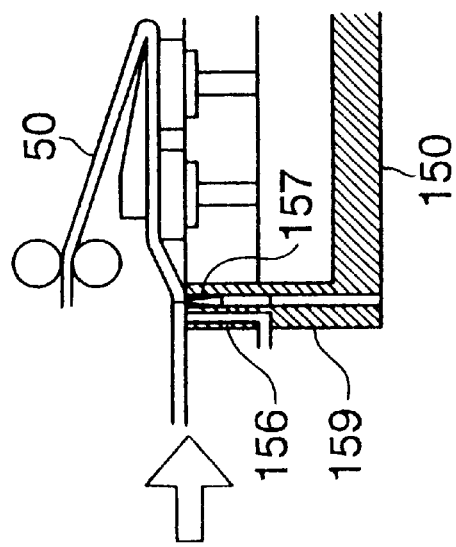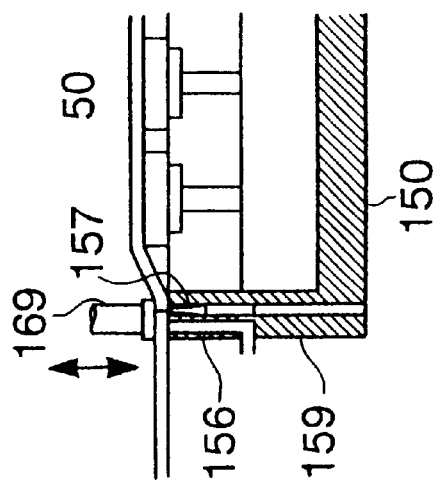

METHOD AND SYSTEM FOR MOUNTING SEMICONDUCTOR DEVICE, SEMICONDUCTOR DEVICE SEPARATING SYSTEM, AND METHOD FOR FABRICATING IC CARD

This application is a Continuation application of application Ser. No. 09/145,221, filed Sep. 1, 1998, now abandoned, the contents of which are incorporated herein by reference in their entirety.

BACKGROUND OF THE INVENTION

1. Field of the Invention

The present invention relates to a method and a system for mounting a semiconductor device or an electronic component, which comprises dicing a semiconductor wafer into semiconductor devices (semiconductor chips) or cutting electronic components attached in a row on a unit basis, picking up the diced semiconductor devices or the cut electronic components, and then mounting them on a mounting board such as a circuit board constructing an IC card or the like; a separating system for the semiconductor device or the electronic component; and an IC card fabricating method.

2. Description of the Related Art

For example, conventional techniques JP-A-6-295930 (hereinafter referred to as a known example 1) and JP-A-6-97214 (hereinafter referred to as a known example 2) for dicing a semiconductor wafer in a state where it is bonded to an adhesive sheet into semiconductor devices (semiconductor chips) and picking up the diced semiconductor devices while peeling them from the adhesive sheet are known.

The known example 1 describes a technique such that the back face of an adhesive sheet from which semiconductor chips to be peeled are bonded is rubbed by sliding pins, thereby weakening the adhesive strength to the semiconductor chips. The semiconductor chips are uniformly lifted by raising pushing pins provided around the sliding pins together with the sliding pins, thereby peeling off the semiconductor chips having the weakened adhesive strength from the adhesive sheet.

The known example 2 describes a technique such that an adhesive sheet to which a number of pellets are adhered is fixedly held with the side of the pellets facing downward, a ball shaped lower end of a needle unit forms a face pressing the adhesive sheet and needles each having a sharp tip are protruded downward from the needle unit. Consequently, the pellets are peeled from the adhesive sheet and are adsorbed by a collet positioned below.

A conventional technique disclosed in JP-A-1-264236 (hereinafter referred to as a known example 3) for dicing a semiconductor wafer adhered to an adhesive sheet into semiconductor devices (semiconductor chips) is also known. The known example 3 describes a wafer breaking technique for cutting and separating semiconductor devices in a wafer state into separate devices by pressing a roller having an expanded central part against the back face of an adhesive sheet adhered to a frame ring by which a semi-full cut wafer is fixed and moving the roller.

A semiconductor chip to be mounted on an IC card or the like, for example, is requested to be thinner from the necessity of reducing the thickness of a product such as an IC card. Consequently, when a product such as an IC card is fabricated by mounting a thin semiconductor chip on a circuit board (mounting board) constructing a product such as an IC card, it is necessary to execute it without damaging or cracking the thin semiconductor chip.

According to the known example 1, however, since the semiconductor chip is peeled from the adhesive sheet by lifting the pushing pins provided around the sliding pins together with the sliding pins so as to uniformly lift the semiconductor chip, the separated area is small for the adhesive face of the semiconductor chip. In case of employing a thin semiconductor chip, the possibility that the thin semiconductor chip cannot be separated but is cracked or damaged is high.

According to the known example 2 as well, the pellets are peeled from the adhesive sheet by downwardly protruding the needle having the sharp tip. Consequently, in case of the thin semiconductor chip, the possibility that it cannot be separated but is cracked or damaged is high.

The known example 3 relates to the wafer breaking technique for separating the semiconductor devices in a wafer state into devices.

As mentioned above, all of the known examples have not considered with respect to a point such that a thin semiconductor wafer adhered to an adhesive sheet is diced into a group of thin semiconductor devices (semiconductor chips) and the group of thin semiconductor devices in a row is peeled from the adhesive sheet and separated from the adhesive sheet by a vacuum collet at high speed without damaging or cracking the semiconductor device.

SUMMARY OF THE INVENTION

It is an object of the invention to solve the above problems and to provide a semiconductor device mounting method and a system for fabricating high-quality products by dicing a thin semiconductor wafer in a state where it is adhered to an adhesive sheet into thin semiconductor devices (semiconductor chips), peeling the group of diced thin semiconductor devices from the adhesive sheet at high speed without damaging or cracking the semiconductor devices, and conveying the group of peeled semiconductor devices in order to mount on the mounting board.

It is another object of the invention to provide a semiconductor device separating system for dicing a thin semiconductor wafer in a state where it is adhered to an adhesive sheet into thin semiconductor devices (semiconductor chips), peeling the group of the diced thin semiconductor devices in a row from the adhesive sheet at high speed without damaging or cracking the semiconductor devices, and separating them by a vacuum collet.

It is still another object of the present invention to provide an electronic component mounting method and system as well as a separating system for fabricating high-quality products by cutting electronic components in a row adhered to an adhesive sheet on a unit basis, peeling the group of the electronic components from the adhesive sheet at high speed without damaging or cracking the electronic components, conveying the group of peeled electronic components in serial order, and mounting them to the mounting board.

It is a further object of the present invention to provide an IC card fabricating method for fabricating high-quality thin IC cards efficiently at low cost.

According to the invention, in order to achieve the object, there is provided a semiconductor device mounting system comprising: separating means for peeling off a group of semiconductor devices for an object obtained by dicing a semiconductor wafer adhered to an adhesive sheet from the adhesive sheet; conveying means for conveying the group of semiconductor devices peeled from the adhesive sheet by the separating means in serial order to a mounting position; and mounting means for relatively positioning an electrode formed in the semiconductor device conveyed by the conveying means and an electrode formed on the mounting board and mounting the semiconductor device onto the mounting board.

According to the invention, there is provided a semiconductor device mounting system comprising: separating means for peeling a group of semiconductor devices in a row for an object obtained by dicing a semiconductor wafer adhered to an adhesive sheet from the adhesive sheet in such a manner that a member having a tip in a projecting shape (including a ball shape) or a curved shape is pushed up against the back face of the adhesive sheet to thereby apply tension to the adhesive sheet and the member is moved from one end of the adhesive sheet to the other end; conveying means for conveying the group of semiconductor devices peeled from the adhesive sheet by the separating means in serial order to a desired mounting position one by one; and mounting means for relatively positioning an electrode formed in the semiconductor device conveyed by the conveying means and an electrode formed on the mounting board and mounting the semiconductor device onto the mounting board.

According to the invention, the separating means in the semiconductor device mounting system is characterized in that a pressing force of the member applied to the back face of the adhesive sheet or a press displacement is controlled. According to the invention, the separating means in the semiconductor device mounting system is characterized in that a pressing force of the member to the back face of the adhesive sheet or a press displacement is controlled so that the semiconductor devices are peeled from the adhesive sheet without being cracked. The separating means in the semiconductor device mounting system is characterized in that a pressing force of the member to the back face of the adhesive sheet or a press displacement is controlled in accordance with the position of the member in the back face of the adhesive sheet.

According to the invention, there is provided a semiconductor device mounting system comprising: separating means for peeling an adhesive sheet from a group of semiconductor devices in a row among semiconductor devices for an object obtained by dicing a semiconductor wafer adhered to the adhesive sheet by clamping an end of the adhesive sheet and pulling the adhesive sheet at least in the direction along the face of the adhesive sheet in a state where the group of semiconductor devices is held by a chuck; conveying means for conveying the group of semiconductor devices peeled from the adhesive sheet by the separating means in serial order to a mounting position; and mounting means for relatively positioning an electrode formed in the semiconductor device conveyed by the conveying means and an electrode formed on the mounting board and mounting the semiconductor device onto the mounting board.

According to the invention, there is also provided a system of mounting semiconductor device comprising: separating means for peeling an adhesive sheet from a group of the semiconductor devices in a row for an object obtained by dicing a semiconductor wafer adhered to the adhesive sheet by clamping an end of the adhesive sheet and pulling the adhesive sheet at least in the direction along the face of the adhesive sheet while the adhesive sheet is forming a bending shape in a state where the group of semiconductor devices is held by a chuck; conveying means for conveying the group of semiconductor devices peeled from the adhesive sheet by the separating means in serial order to a mounting position; and mounting means for relatively positioning an electrode formed in the semiconductor device conveyed by the conveying means and an electrode formed on the mounting board and mounting the semiconductor device onto the mounting board.

According to the invention, separating means in the semiconductor device mounting system is characterized in that a forming mechanism for forming a bending shape of the adhesive sheet peeled from the semiconductor devices in a linear shape part moves in accordance with the movement of the peeled linear shaped part when the adhesive sheet is peeled by being pulled. The above forming mechanism is characterized in comprising a wedge-shaped jig located in the bending part of the adhesive sheet. The forming mechanism is also characterized in comprising a member pressing the bending part of the adhesive sheet.

According to the invention, the separating means is characterized in that a periphery of the adhesive sheet is fixed to that of the chuck. According to the invention, the separating means is characterized in that the direction of pulling the adhesive sheet is the same to that of arranging semiconductor device on the face of the adhesive sheet. According to the invention, the separating means is characterized in that the direction of pulling the adhesive sheet tilts against the direction of semiconductor devices on the face of the adhesive sheet.

According to the invention, the semiconductor device mounting system is characterized in that the plurality of separating means is disposed so that a face of an object turns sidelong.

According to the invention, there is also provided a method of mounting a semiconductor device comprising: a separating step of peeling off a group of semiconductor devices in a row for an object obtained by dicing a semiconductor wafer adhered to an adhesive sheet from the adhesive sheet; a conveying step of conveying the group of semiconductor devices peeled from the adhesive sheet by the separating means in serial order to a mounting position; and a mounting step of relatively positioning an electrode formed in the semiconductor device conveyed in the conveying step and an electrode formed on a mounting board and mounting the semiconductor device onto the mounting board.

According to the invention, there is also provided a method of mounting a semiconductor device comprising: a separating step of peeling off a group of semiconductor devices in a row among semiconductor devices for an object obtained by dicing a semiconductor wafer adhered to an adhesive sheet from the adhesive sheet in such a manner that a member having a tip in a projecting shape or a curved shape is pushed up against the back face of the adhesive sheet thereby to give tension to the adhesive sheet and the member is moved from one end of the adhesive sheet to the other end; a conveying step of conveying the group of semiconductor devices peeled from the adhesive sheet in the separating step in serial order to a mounting position; and a mounting step of relatively positioning an electrode formed in the semiconductor device conveyed in the conveying step and an electrode formed on a mounting board and mounting the semiconductor device onto the mounting board.

According to the invention, there is also provided a semiconductor device mounting method comprising: a separating step of peeling off an adhesive sheet from a group of semiconductor devices in a row for an object obtained by dicing a semiconductor wafer adhered to the adhesive sheet by clamping an end of the adhesive sheet and pulling the adhesive sheet at least in the direction along the face of the adhesive sheet in a state where the group of semiconductor devices are held by a chuck; a conveying step of conveying the group of semiconductor devices peeled from the adhesive sheet in the separating step in serial order to a mounting position; and a mounting step of relatively positioning an electrode formed in the semiconductor device conveyed in the conveying step and an electrode formed on the mounting board and mounting the semiconductor device onto the mounting board.

According to the invention, there is provided a semiconductor device mounting method comprising: a separating step of peeling an adhesive sheet from a group of semiconductor devices in a row among semiconductor devices as an object obtained by dicing a semiconductor wafer adhered to the adhesive sheet by clamping an end of the adhesive sheet and by pulling the adhesive sheet at least in the direction along the face of the adhesive sheet in a state where the group of semiconductor devices are held by a chuck; a conveying step of conveying the group of semiconductor devices peeled from the adhesive sheet in the separating step in serial order in a desired unit to a mounting position on a semiconductor device unit basis; and a mounting step of relatively positioning an electrode formed in the semiconductor device conveyed in the conveying step and an electrode formed on a mounting board and mounting the semiconductor device onto the mounting board.

According to the invention, there is provided a semiconductor device mounting method comprising: a separating step for peeling an adhesive sheet from a group of semiconductor devices in a row for an object obtained by dicing a semiconductor wafer adhered to the adhesive sheet by clamping an end of the adhesive sheet and pulling the adhesive sheet at least in the direction along the face of the adhesive sheet while forming the bending shape of the adhesive sheet in a state where the group of semiconductor devices is held by a chuck; a conveying step for conveying the group of semiconductor devices peeled from the adhesive sheet in the separating step in serial order to a mounting position; and a mounting step for relatively positioning an electrode formed in the semiconductor device conveyed in the conveying step and an electrode formed on the mounting board and mounting the semiconductor device onto the mounting board.

A semiconductor device separating system for peeling a group of semiconductor devices in a row among semiconductor devices for an object obtained by dicing a semiconductor wafer adhered to the adhesive sheet from the adhesive sheet in such a manner that a member having a tip in a projecting or curved shape is pushed up against the back face of the adhesive sheet to thereby apply tension to the adhesive sheet and the member is moved from one end to the other end of the adhesive sheet.

According to the invention, there is also provided a semiconductor device separating system for peeling an adhesive sheet from a group of semiconductor devices in a row among semiconductor devices for an object obtained by dicing a semiconductor wafer adhered to the adhesive sheet by clamping an end of the adhesive sheet and pulling the adhesive sheet at least in the direction along the face of the adhesive sheet in a state where the group of semiconductor devices is held by a chuck.

According to the invention, the semiconductor device separating system is characterized in that a forming mechanism for forming a bending shape of the adhesive sheet peeled from the semiconductor devices in a linear shape part moves in accordance with the movement of the above mentioned peeled linear shape part when the adhesive sheet is peeled by being pulled.

The above mentioned forming device is characterized in comprising a wedge-shaped tool located in the bending part of the adhesive sheet. The forming device is also characterized in comprising a member pressing the bending part of the adhesive sheet. And according to the invention, it is characterized in that a periphery of the above mentioned adhesive sheet is fixed to that of the chuck. According to the invention, it is characterized in that the direction of pulling the adhesive sheet is the same to that of arranging semiconductor devices on the face of the adhesive sheet. According to the invention, it is characterized in that the direction of pulling the adhesive sheet tilts against the direction of semiconductor devices on the face of the adhesive sheet. And according to the invention, the chuck face holding the group of semiconductor devices is characterized in being coated with a fluorine resin film.

According to the invention, the method and system for mounting semiconductor device and the separating system are characterized in that instead of the semiconductor wafer, electronic components like chip-size packages are attached in row with boards or tapes.

And, according to the invention, there is provided an IC card fabricating method comprising: a step for forming conductor patterns on a single side of a film; a mounting step for peeling the group of the semiconductor devices from the adhesive sheet for an object obtained by dicing a semiconductor wafer adhered to the adhesive sheet, conveying the group of the peeled semiconductor devices in serial order to the mounting position, and relatively positioning and mounting an access terminal of the conveyed semiconductor devices to the conductor pattern formed in the above conductor pattern forming step, and fixing the conductor devices to the film with a temporary fixing fluid; and a laminating step for heating/pressing and laminating an adhesive cover film on a single side of the film, and connecting an access terminal of the semiconductor devices fixed to the film to the conductor pattern.

According to the invention, the conductor pattern forming step in the IC card fabricating method is characterized in forming a conductor pattern by printing a conductor paste in a desired pattern on the single side of the film and drying the printed conductor paste.

According to the invention, a mounting step in the IC card fabricating method is characterized in peeling the adhesive sheet from the group of semiconductor devices for the object obtained by dicing a semiconductor wafer adhered to the adhesive sheet, by clamping an end of the adhesive sheet and pulling the adhesive sheet at least in the direction along the face of the adhesive sheet in a state where the group of the semiconductor devices is held by a chuck, conveying the group of peeled semiconductor devices in serial order to the mounting position, relatively positioning and mounting an access terminal of the conveyed semiconductor device to the conductor pattern formed in the conductor pattern forming step and fixing the semiconductor device in the film with a temporary fixing fluid.

According to the invention, there is provided an IC card fabricating method comprising: a conductor pattern forming step for forming a conductor pattern on a single side of a film; a mounting step for peeling a group of semiconductor devices from the adhesive sheet for an object obtained by dicing a semiconductor wafer adhered to an adhesive sheet, conveying the group of peeled semiconductor devices in serial order to the mounting position, and relatively positioning and mounting the access terminal of the conveyed semiconductor devices to the conductor pattern formed in the conductor pattern forming step; a laminating step for heating/pressing an adhesive cover film on a single side of the film and connecting the access terminal of the mounted semiconductor device to the conductor pattern.

As mentioned above, by using the constructions, a thin semiconductor wafer which has the thickness of about 0.002 to 0.2 mm and is adhered to an adhesive sheet is diced into thin semiconductor devices (semiconductor chips), the group of diced thin semiconductor devices is peeled from an adhesive sheet at high speed without damaging and cracking the semiconductor devices, separated by a vacuum collet, and mounted on a mounting board (circuit board), thereby enabling a high-quality thin product such as an IC card to be fabricated.

According to the construction above, it is possible to fabricate a high-quality products by cutting electronic components in row adhered to an adhesive sheet on a unit basis, peeling the group of cut electronic components from an adhesive sheet at high speed without damaging and cracking the electronic components, separating them by a vacuum collet, and mounting them as they are on a mounting board (circuit board).

According to the construction above, it is possible to fabricate a high-quality thin IC card efficiently at low cost.

BRIEF DESCRIPTION OF THE DRAWINGS

FIG. 1 is a schematic construction diagram showing a first embodiment of a whole system for dicing a thin semiconductor wafer into thin semiconductor chips and mounting the thin semiconductor chips on a circuit board constructing an IC card or the like according to the invention;

FIGS. 16A to E are a specific construction diagram showing the first embodiment of the whole system for dicing the thin semiconductor wafer into thin semiconductor chips and mounting the semiconductor chips onto the circuit board constructing the IC card or the like according to the invention;

FIGS. 19A to D are a diagram for explaining the principle of the separation mechanism part in a second embodiment of the whole system for dicing a thin semiconductor wafer into thin semiconductor chips and mounting the semiconductor chips onto a circuit board constructing an IC card or the like according to the invention;

FIGS. 27A to D are a diagram showing a case when a periphery of the adhesive sheet is fixed to that of a chuck;

DETAILED DESCRIPTION OF THE PREFERRED EMBODIMENTS

Figure 2A:
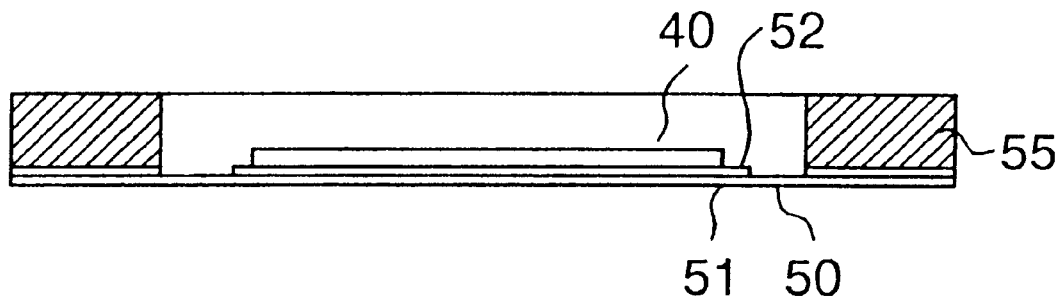
FIGS. 2A to C are a diagram for explaining a method of fabricating a work supplied to an separation mechanism part according to the invention.

Embodiments of the invention will be described with reference to the drawings.

FIG. 1 is a diagram showing a schematic construction showing a first embodiment of a whole system for dicing (cutting) a thin semiconductor wafer (semiconductor board) into thin semiconductor chips (semiconductor devices) and mounting the semiconductor chips onto a circuit board constructing an IC card or the like according to the invention. The system is constructed by: a separation mechanism part (separating means) 100 for dicing (cutting) a thin semiconductor wafer (semiconductor board) 10 having the thickness of 0.002 to 0.2 mm into thin semiconductor chips (semiconductor devices) 10 having the thickness of about 0.002 to 0.2 mm and for adsorbing a group 20 of thin semiconductor chips (semiconductor devices) in a row state at once by a vacuum collet 101; a separation conveyer part (conveying means) 200 for separating and inverting each thin semiconductor chip from the group 20 of thin semiconductor chips (semiconductor devices) in a row state obtained by separating the thin semiconductor wafer (semiconductor board) by the separating mechanism part 100 and for adsorbing the inverted thin semiconductor chip by a vacuum nozzle 216; and a mounting mechanism part (mounting means) 300 for positioning the thin semiconductor chip 10 adsorbed and conveyed by the vacuum nozzle 216 in the separation conveyer part 200 and mounting it on a circuit board 30 constructing an IC card or the like. Besides to the semiconductor wafer, this system is applicable to a semiconductor devices such as a chip size package and the like the plurality of which is attached together with a board or a tape.

A method of fabricating a work 60 supplied and put on a stage 61 in the separation mechanism part 100 will be described with reference to FIG. 2.

In a thin semiconductor wafer 40, semiconductor circuits are formed on a chip unit basis by a regular semiconductor fabricating method on a base material such as silicon. The thin semiconductor wafer 40 in which the semiconductor circuits are formed in the above manner is sorted into non-defective pellets and defective pellets which can be repaired by an electric characteristics test, visual inspection, or the like. The defective pellet is marked or the position coordinates of the defective pellet are stored in a recording medium or a storage of an inspection system in correspondence to the item number of the thin semiconductor wafer.

On the back face of the thin semiconductor wafer 40 inspected as mentioned above, an adhesive sheet 50 which is larger than the outer shape of the semiconductor wafer 40 is adhered in a sheet adhering process. The adhesive sheet 50 has a sheet base material 51 formed in a thin film state which is made of a resin having elasticity such as PVC (polyvinyl chloride) or PET (polyethylene terephthalate) having the diameter larger than that of the wafer. On one of the faces of the sheet base material 51, a predetermined adhesive is applied, thereby forming an adhesive layer 52. The adhesive has the property such that the adhesive is a polyimide base material and is hardened by being irradiated with ultra violet (UV) rays and the adhesion is weakened.

For an adhesive agent, an acrylic base material which has the property of hardening and weakening the adhesive strength under heat is also applicable. As a matter of course, when using this adhesive agent, this is heated instead of being irradiated with ultra violet (UW) rays.

Subsequently, in a jig attaching process, as shown in FIG. 2A, the peripheral part of the adhesive sheet 50 to which the thin semiconductor wafer 40 is adhered is stretched and adhered to a metallic frame (carrier ring) 55 made of stainless steel or the like while being spread so as not to be slacked.

Figure 2B:
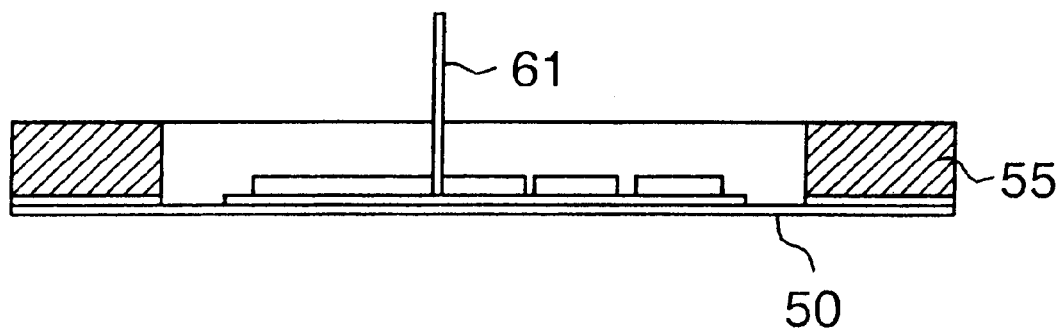

The thin semiconductor wafer 40 adhered onto the adhered sheet 50 attached to the metallic frame (carrier ring) 55 is diced into thin semiconductor chips by using a thin grinder 61 as shown in FIG. 2B in a dicing process. The thin semiconductor wafer 40 can be diced since the adhesive sheet 50 is adhered with adhesive strength sufficient to hold at the time of dicing. Since the adhesive sheet 50 is not diced by the dicing operation, the group 20 of diced semiconductor chips are adhered to the adhesive sheet 50 by the adhesion.

Figure 2C:
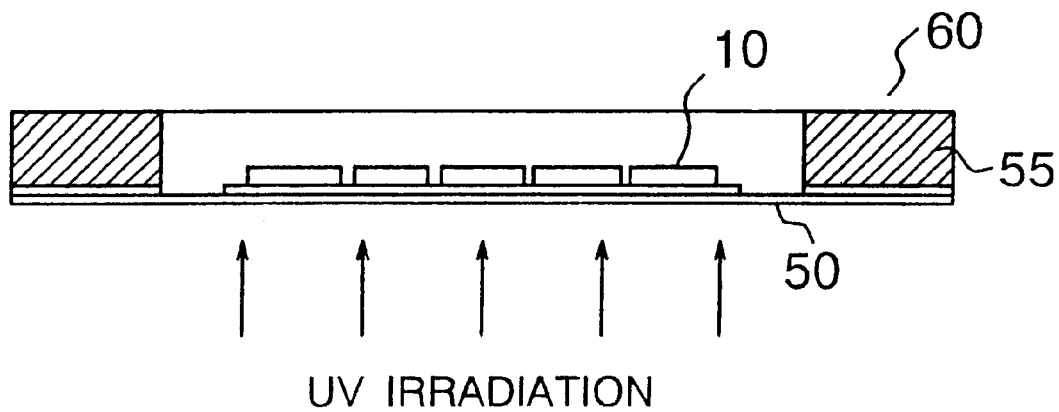

As shown in FIG. 2C, the areas in which the semiconductor chips 10 are adhered to the adhesive sheet 50 are irradiated with ultra violet (UV) rays and the adhesive 52 on the adhesive sheet 50 is hardened, thereby weakening the adhesive strength.

The work 60 fabricated as mentioned above is supplied to the separation mechanism part 100 and mounted and fixed onto the movable stage 61.

Figure 3:
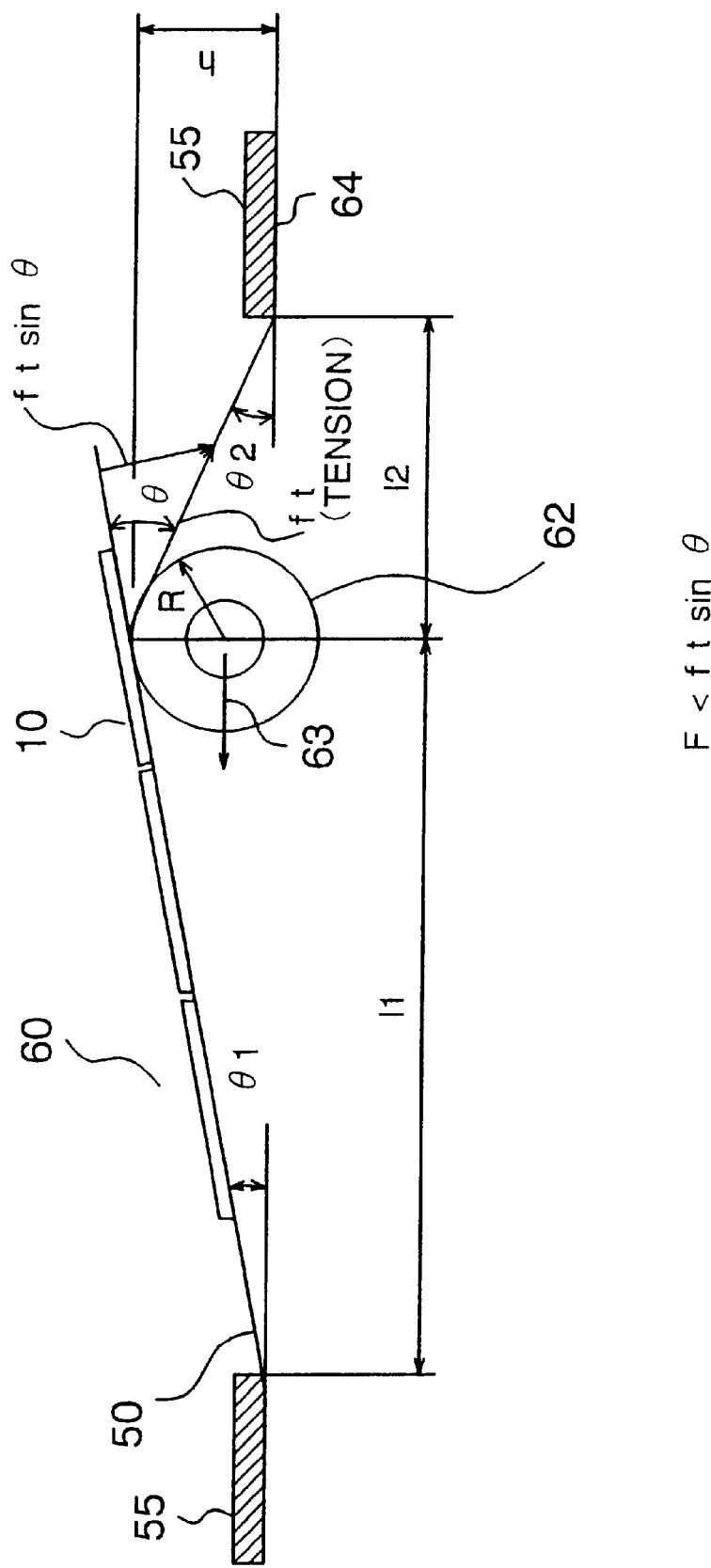
FIG. 3 is a front cross section of the work for explaining the principle of the separation mechanism part according to the invention.
Figure 4:
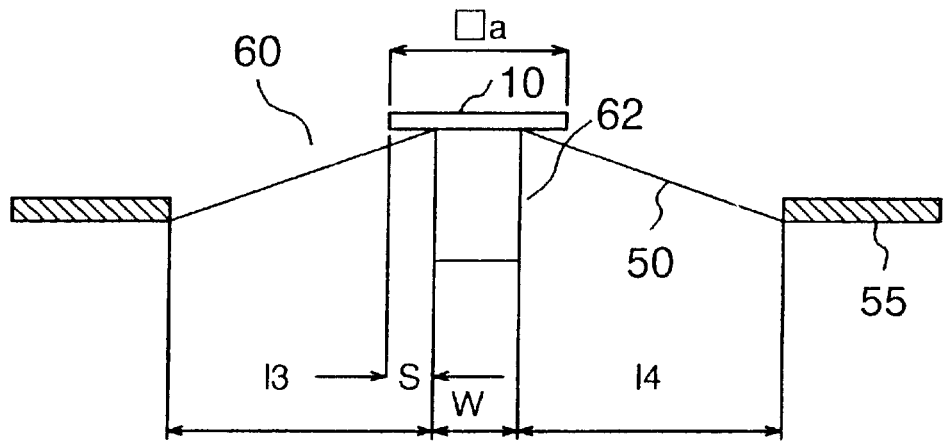
FIG. 4 is a side cross section of FIG. 3.
Figure 5:
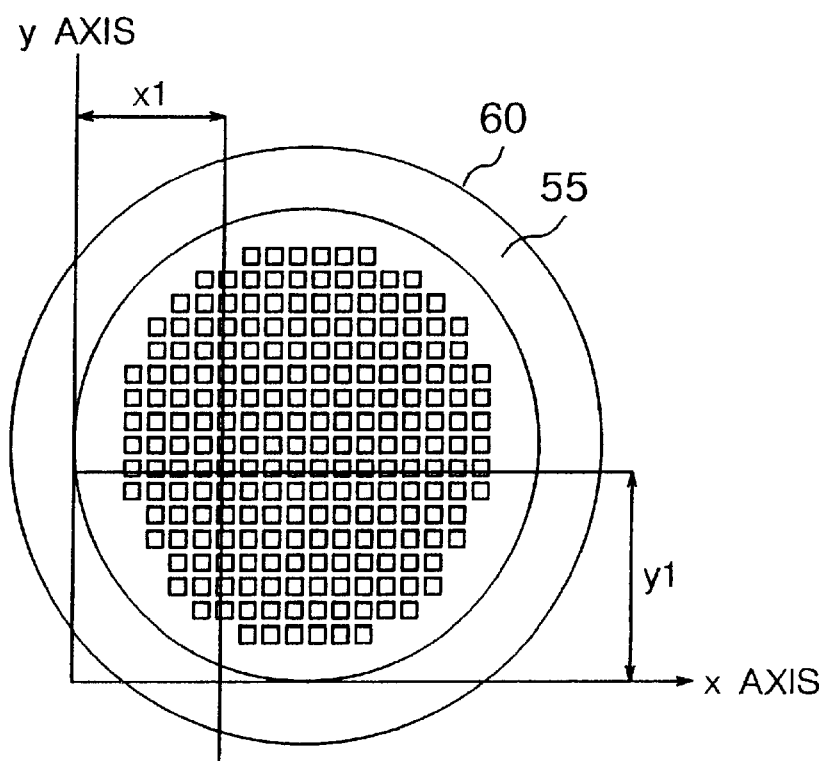
FIG. 5 is a plan view of the work for explaining the principle of the separation mechanism part according to the invention.
Figure 6A:
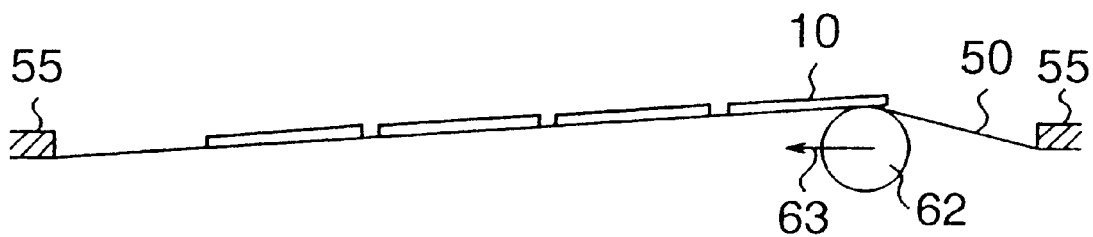
FIGS. 6A to C are a diagram showing a state in which semiconductor chips are peeled from an adhesive sheet when a roller or ball member for peeling chips according to the invention is raised and moved.
Figure 6B:
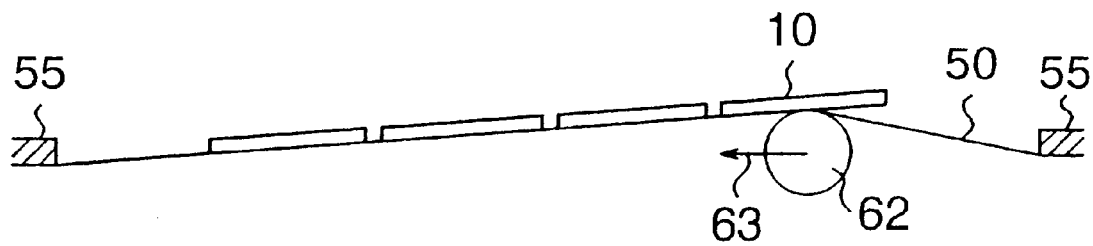
Figure 6C:
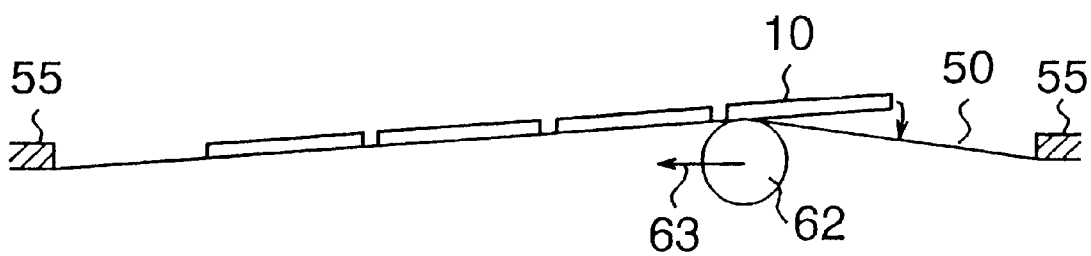

The principle of the separation mechanism part 100 according to the invention will be described with reference to FIGS. 3 to 6. FIG. 3 is a front view showing a method of peeling off the group of semiconductor chips 10 in a row and placing them in the same position every row. FIG. 4 is a side view of FIG. 3. In FIG. 4, W denotes the width of a chip peeling roller. The width (a) of the thin semiconductor chip 10 is consequently equal to (W+2S). FIGS. 3 and 4 show a method of peeling off the group of semiconductor chips in a row arranged on the coordinates x1 shown in FIG. 5 from the adhesive sheet 50 and placing them in the same position. Consequently, x1=13+(W/2). FIG. 3 shows a state where the chip peeling roller or ball member 62 (hereinafter referred to as a member 62) is moved from an end of the adhesive sheet 50 and is positioned at (12=y1).

That is, by moving the member 62 from one end of the adhesive sheet to the other end as shown by the arrow 63 in a state where the member 62 is pushed up against the rear face of the adhesive sheet 50 with a predetermined pressure so hat tension applied to the adhesive sheet 50 lies within the elastic limit, the group of thin semiconductor chips in a row is peeled from the adhesive sheet 50 and is placed in the same position. In a state where the member 62 is in a position 13, 14 from both ends of the metallic frame 55 as shown in FIG. 4 and in a position 11, 12 from both ends of the metallic frame 55 as shown in FIG. 3 for the group of thin semiconductor chips each having the dimension of (a×a), when the member 62 is pushed up with a predetermined pressure so that the tension applied to the adhesive sheet 50 lies within the elastic limit, the adhesive sheet 50 is inclined at angles of θ1 and θ2 from the horizontal face 64 (the under face of the metallic frame 55). A peeling force f t sin θ acts on each chip 10 from the one end to the other end with the movement of the member 62. When the peeling force f t sin θ is greater than the adhesive strength F, the semiconductor chip 10 is once peeled from the adhesive sheet 50 from one end toward the other end from the state shown in FIG. 6A to the state shown in FIG. 6B, and from the state shown in FIG. 6B to the state shown in FIG. 6C. As mentioned above, by linearly moving the member 62 along the group of thin semiconductor chips in a row from one end to the other end of the adhesive sheet 50 within the metallic frame 55 in a state where the member 62 is pushed up with a predetermined pressure, all of the thin semiconductor chips in the row are easily peeled from the adhesive sheet 50 and are placed in the same position without being cracked or damaged. (ft) denotes the tension applied on the adhesive sheet 50 when the member 62 is pushed up with a predetermined pressure. The peeling angle θ has the relation of about (θ1+θ2). Reference character (R) denotes the radius of curvature of the member 62. It is sufficient to set the radius (R) of curvature within a range where the semiconductor chip is not damaged or cracked, for example, from about 2 to 5 mm. When reference numeral 62 is constructed by the chip peeling roller, it can be rotatably supported.

Figure 7A:
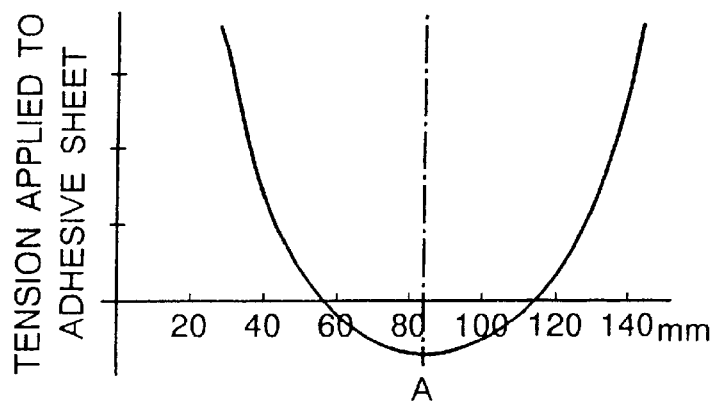
FIGS. 7A to D are a diagram showing change in tension applied to the adhesive sheet and change in a separation angle θ in accordance with a position along the adhesive sheet face in the roller or ball member for peeling chips according to the invention.
Figure 7C:
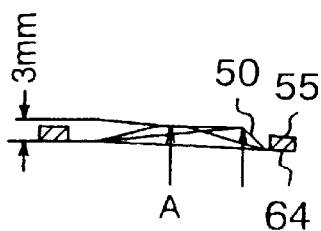

FIGS. 7A and 7C show change in the tension ft applied to the adhesive sheet 50 when the back face of the adhesive sheet 50 is pushed up by the member 62 from an adhesive sheet bending face 64 of the metallic frame 55 by, for instance, 3 mm. The axis of abscissa denotes the position of the adhesive sheet 50 adhered to the metallic frame 55. Reference character A shows the center position of the adhesive sheet 50. When the lifting amount is, for example, 3 mm in the embodiment as shown in FIG. 7C, the length of the adhesive sheet 50 in the case where the member 62 is positioned in a peripheral part is longer than that of the case where the member 62 is positioned in the center position by about 0.15 mm. The tension ft applied to the adhesive sheet 50 increases exponentially with movement of the member 62 from the center to the peripheral part. On the contrary, the tension ft applied to the adhesive sheet 50 decreases with movement of the member 62 from the peripheral part to the center.

Figure 7B:
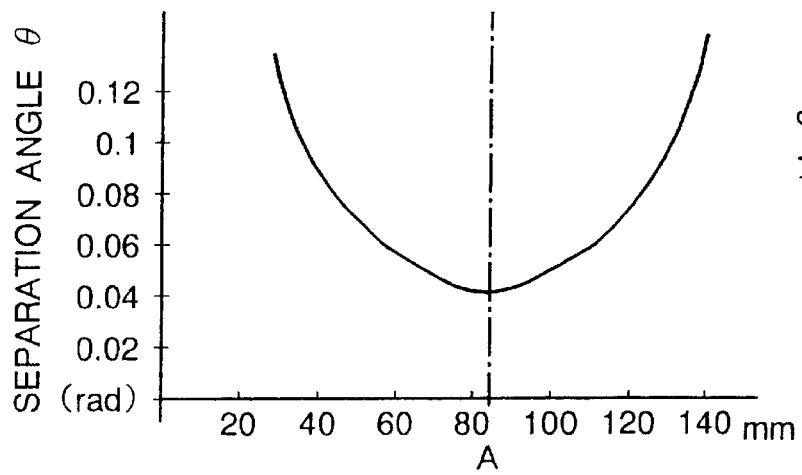
Figure 7D:
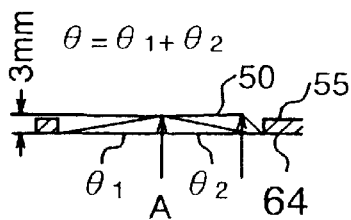

FIGS. 7B and 7D show change in the peeling angle θ=θ1+θ2 in the case where the back face of the adhesive sheet 50 is pushed up by the member 62 by, for example, 3 mm from the adhesive sheet bonding face 64 of the metallic frame 55. The axis of abscissa denotes the position in the adhesive sheet 50 adhered to the metallic frame 55. Reference character (A) shows the center position of the adhesive sheet 50. As shown in FIG. 7B, when the lifting amount is, for example, 3 mm in the embodiment, the peeling angle θ increases exponentially with movement of the member 62 from the center to the peripheral part. On the contrary, the peeling angle θ decreases with movement of the member 62 from the peripheral part to the center.

The peeling force f t sin θ acting on the adhesive sheet 50 from the end for the thin semiconductor chip 10 accordingly decreases with the movement of the member 62 from the peripheral part to the center. Naturally, the pressing force acting on the member 62 also decreases with the movement from the peripheral part to the center.

On the other hand, the pushing force P by the member 62 and the tension ft acting on the adhesive sheet 50 have the approximation relation of (formula 1) shown below when the frictional resistance between the member 62 and the adhesive sheet 50 is ignored. When the member 62 is not rotatable but is fixed, however, the frictional resistance between the member 62 and the adhesive sheet 50 cannot be ignored, the tension ft acting on the adhesive sheet 50 increases by an amount corresponding to the frictional resistance, and the peeling force f t sin θ naturally increases.

$$P = ft \cdot (\sin \theta_1 + \sin \theta_2) \quad \text{(formula 1)}$$

Consequently, the peeling force f t sin θ has the approximation relation of (formula 2) shown as follows.

$$f\, t\, \sin \theta = P \cdot \sin \theta_1 / (\sin \theta_1 + \sin \theta_2) \quad \text{(formula 2)}$$

From the relation, by increasing the force P pushing the back face of the adhesive sheet 50 by the member 62 according to the movement of the member 62 from the peripheral part to the center within the elastic limit of the tension ft acting on the adhesive sheet 50, the peeling force f t sin θ acting on the adhesive sheet 50 is increased so as to be greater than the adhesive strength F. Even if the thin semiconductor chip 10 is positioned in the center part, it can be easily peeled from the adhesive sheet 50 and positioned in the same place.

When the force P pushing the back face of the adhesive sheet 50 by the member 62 is increased, the tension ft acting on the adhesive sheet 50 also increases. When the tension ft acting on the adhesive sheet 50 exceeds the elastic limit, however, the adhesive sheet 50 becomes slack. The tension ft acting on the adhesive sheet 50, therefore, has to be within the elastic limit. On the other hand, since the adhesive sheet 50 has orientation and the elastic limit in the flow direction (orientation direction) is larger than that in the perpendicular direction, it is necessary to set the flow (orientation) direction in the y-axis direction shown in FIG. 5 and to adhere the semiconductor wafer 40 to the adhesive sheet 50. By the operation, the elastic limit in the y-axis direction in the adhesive sheet 50 can be increased, the force P for pushing the back face of the adhesive sheet 50 by the member 62 can be increased for the whole area, the peeling force f t sin θ is increased, and the group of thin semiconductor chips in a row can be easily peeled from the adhesive sheet 50.

The crack condition of the thin semiconductor chip having the thickness of about 0.002 to 0.2 mm relates to a case based on the relation of (formula 3) shown as follows where the semiconductor chip is not peeled from the adhesive sheet 50 and bending equal to or less than the radius ρ of curvature is applied to the semiconductor chip.

$$1/\rho = M/(EI) \quad \text{(formula 3)}$$

where M is a bending moment which can be permitted to the thin semiconductor chip, E is Young's modulus of the semiconductor chip, and I is geometrical moment of inertia by the thin semiconductor chip.

Even if the radius R of curvature of the member 62 pushing up the back face of the adhesive sheet 50 is equal to or less than the radius ρ of curvature obtained from the relation of (formula 3), for example, about 2 to 5 mm, however, when the peeling force f t sin θ greater than the adhesive strength F is acted from one end of the semiconductor chip by the tension ft occurring in the adhesive sheet 50, the thin semiconductor chip is peeled from the adhesive sheet without being cracked.

A first embodiment of the separation mechanism part 100 according to the invention will be described with reference to FIGS. 8, 9, and 10. The work 60 is ejected from a cassette housed in a magazine (not shown) and is loaded onto the stage 61. The reason why the work is inserted into cassette or the like and is housed in the magazine without being exposed to the atmosphere is that, if the work 60 is left naked, as shown in FIG. 2C, the area adhered to the adhesive sheet 50 in the semiconductor chip 10 is irradiated with ultra violet rays (UV) to harden the adhesive 52 in the adhesive sheet 50 and the adhesive strength F is increased although it is slight. It is therefore desired to insert the work 60 in a cassette or the like so as not to be exposed to the atmosphere or ultra violet rays so that the adhesive strength is not increased. The adhesive strength F is maintained to be almost constant by inserting the work 60 in the cassette or the like and housing in the magazine or the like so that the adhesive of the adhesive sheet does not change chemically as mentioned above. Consequently, only by pushing the back face of the adhesive sheet 50 by the member 62, the group of semiconductor chips in a row state can be easily peeled off and placed in the same position without being cracked or damaged. When change in the environment (for example, the temperature) of the magazine and the separation mechanism part 100 is prevented, the characteristics of the adhesive of the adhesive sheet after irradiation of UV are not changed and the adhesive force F can be maintained to be almost constant.

Reference numeral 61 is the stage on which the work 60 ejected from the cassette housed in the magazine (not shown) is put and is sandwiched by a fixing means 65. The stage 61 is supported by a column 77 so as to be movable in the x-axis direction and is constructed to be moved step by step at the pitch of the thin semiconductor chip row by a feeding mechanism 78 having a drive source such as a motor controlled by a controller 80 in the x-axis direction shown in FIG. 5. When the work 60 is put on the stage 61, the orientation direction of the adhesive sheet 50 is set in the y-axis direction. Reference numeral 76 denotes a base; 74 a guide stage mounted on the base 76; 72 a stage for reciprocating the member 62 in the y-axis direction, which is reciprocated in the y-axis direction on the guide stage 74 by a feeding mechanism 73 connected to an output of a drive source 75 such as a motor controlled by the controller 80; 67 a rod member which has an end to which the member 62 is attached and is supported so as to be movable in the vertical direction by a supporting member 68 to be pushed up by a spring member 66; 69 a vertical moving member to which the supporting member 68 is attached and which is moved vertically above the stage 72 by a feeding mechanism 70 connected to the output of a drive source 71 such as a motor controlled by the controller 80; 81 a storage for storing a control program, control data, and the like, which is connected to the controller 80 constructed by a computer or the like; and 82 a display means which outputs and displays the control data and the like and is connected to the controller 80.

Figure 9A:
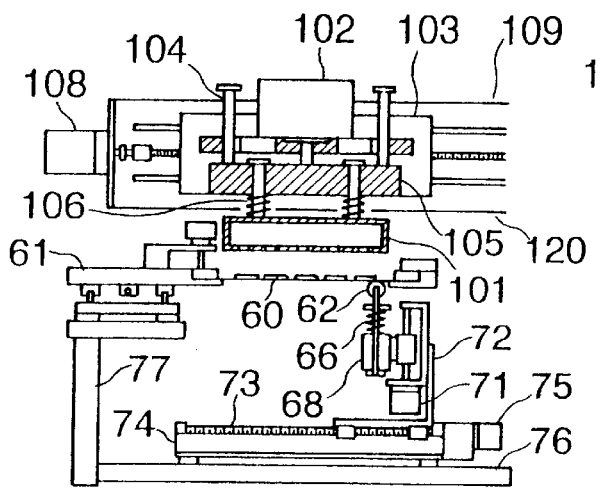
FIGS. 9A to D are a diagram showing a process in which a group of semiconductor chips in a row is peeled from the adhesive sheet when the roller or ball member for peeling chips is lifted and moved in the first embodiment of the separation mechanism part according to the invention.
Figure 9B:
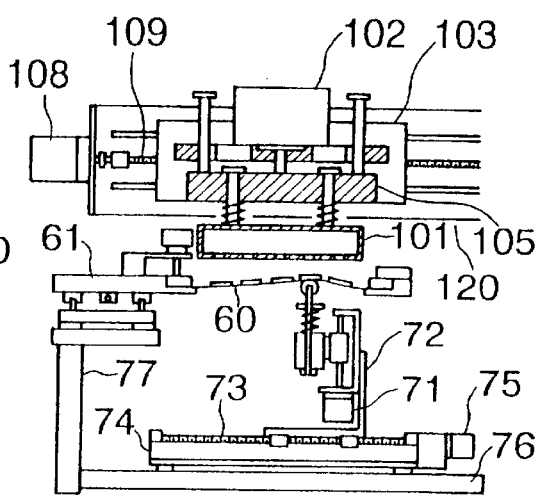
Figure 9C:
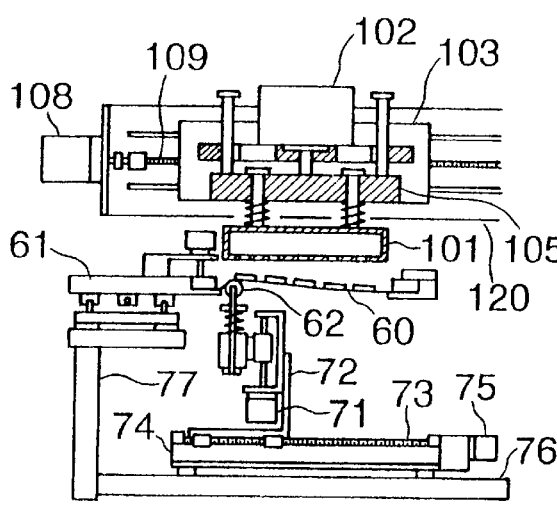
Figure 9D:
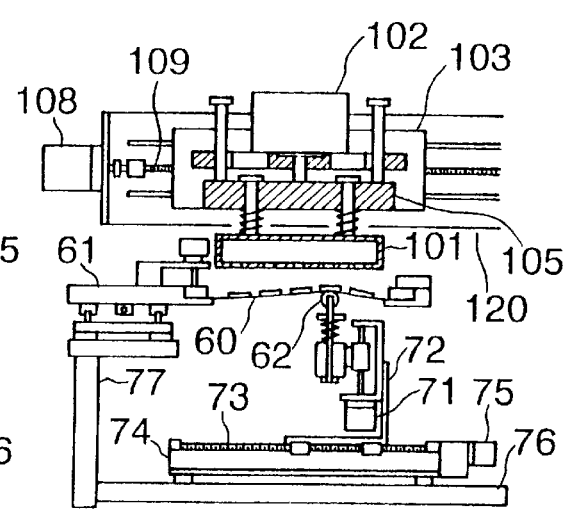
Figure 10A:
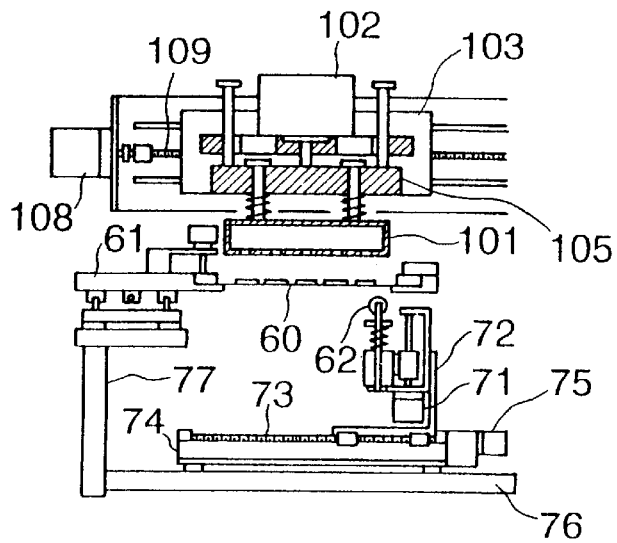
FIGS. 10A to C are a diagram showing a process in which the group of semiconductor chips in the row peeled from the adhesive sheet is adsorbed by a vacuum collet subsequent to FIG. 9.
Figure 10B:
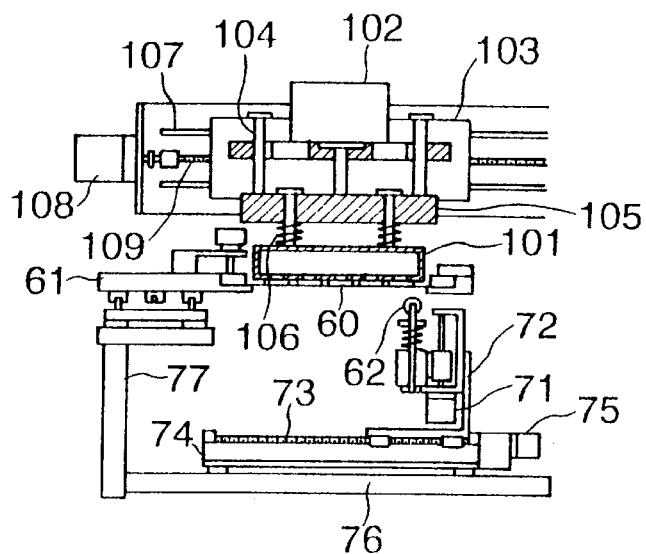
Figure 10C:
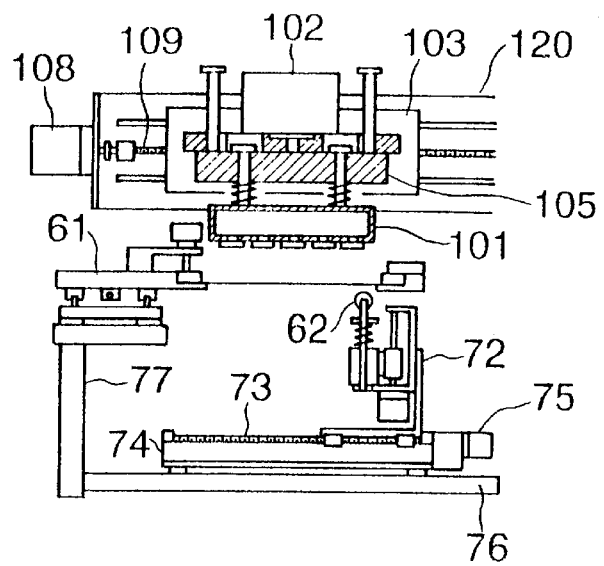
Figure 11A:
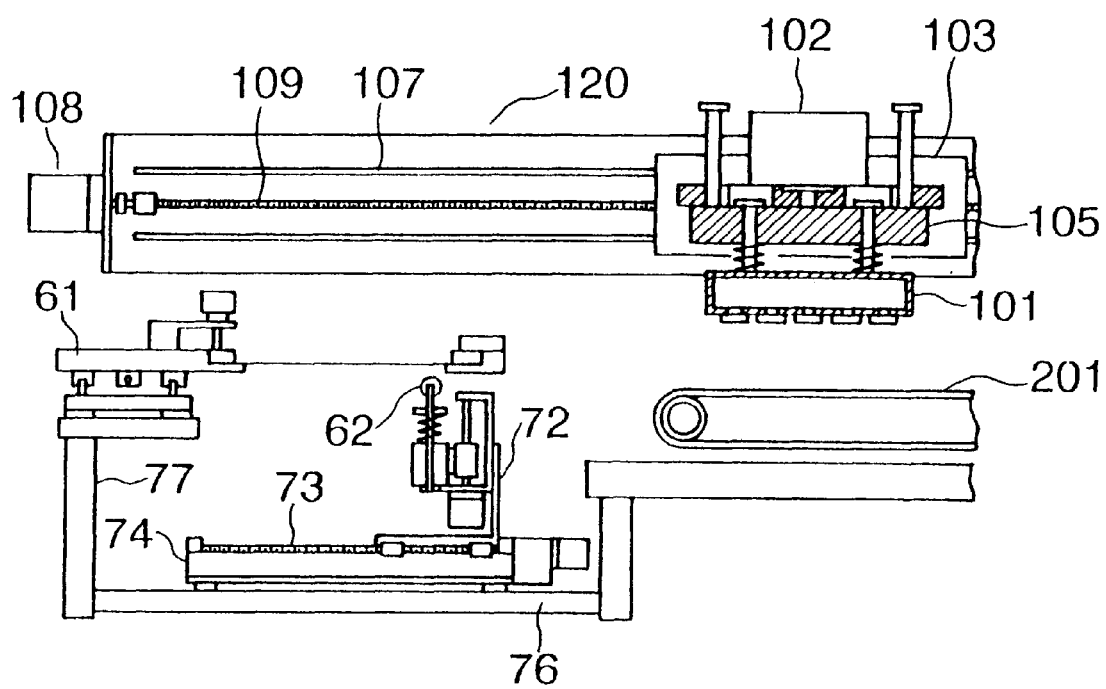
FIGS. 11A and B are a diagram showing a process in which the group of semiconductor chips in the row adsorbed by the vacuum collet is conveyed onto a conveyer subsequent to FIG. 10.
Figure 11B:
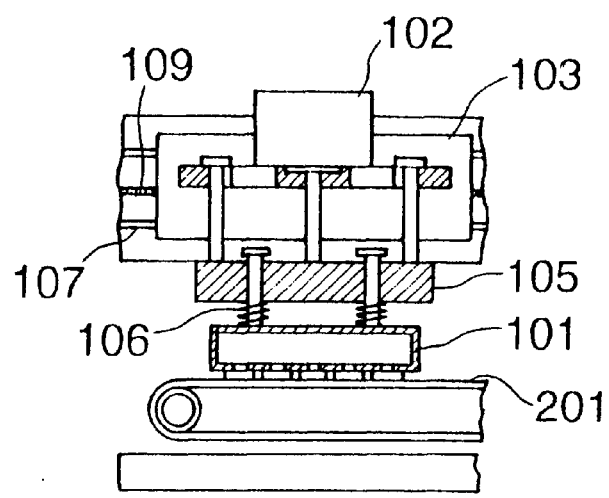
Figure 12:
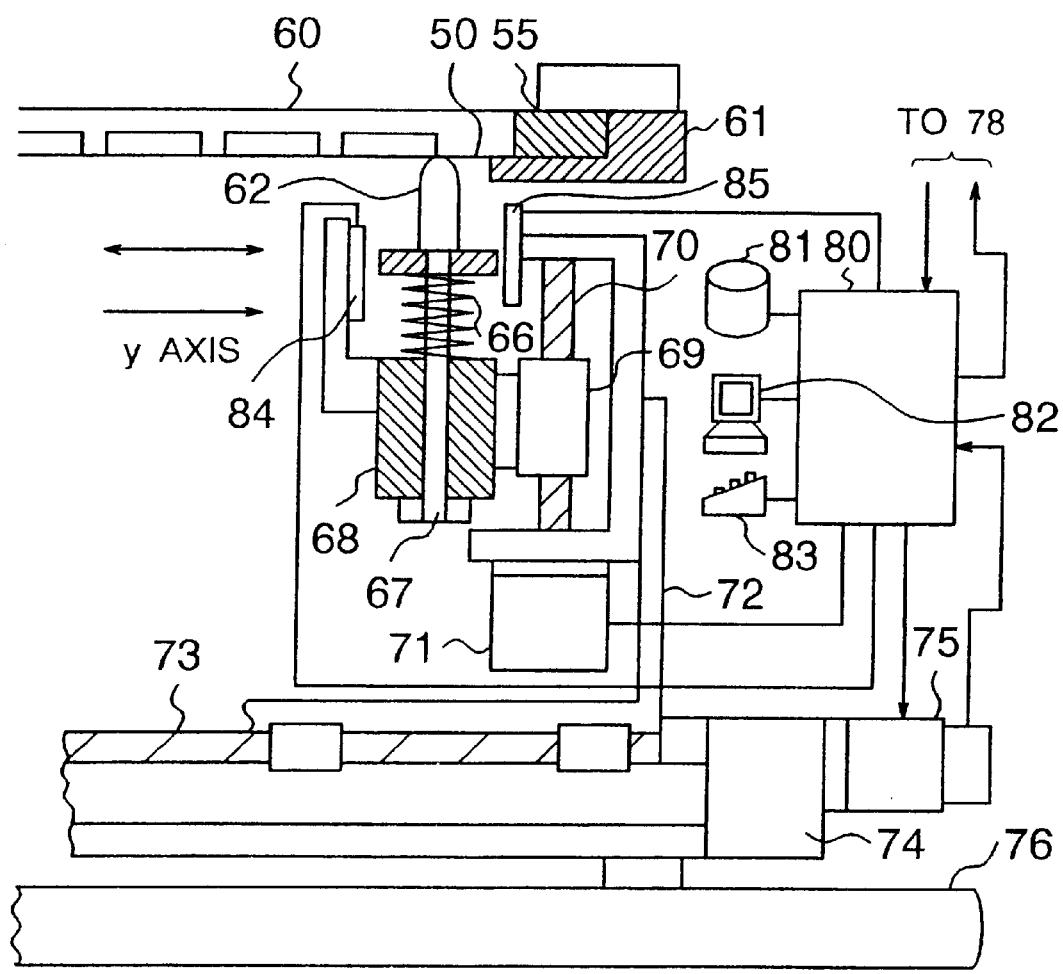
FIG. 12 is a front view showing a schematic construction of a second embodiment of the separation mechanism part according to the invention.
Figure 13A:
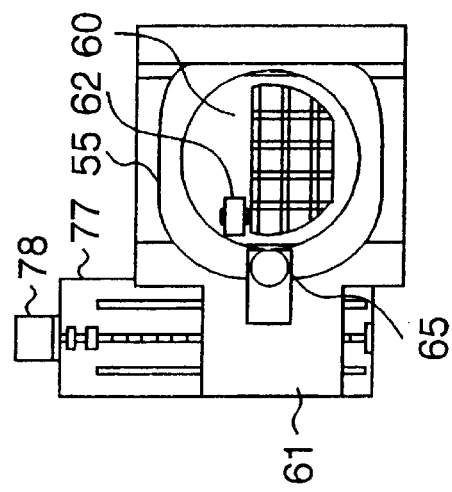
FIGS. 13A to C are a diagram showing a stage on which the work is put and the movement of the roller or ball member for peeling chips in the separation mechanism part according to the invention.

In the case of the first embodiment, as shown in FIG. 13A, the stage 61 is moved in response to a control command from the controller 80 and the group of thin semiconductor chips in the row at the end in the x-axis direction is positioned so as to face the line on which the member 62 is reciprocated. Coordinate information of the work 60 is inputted by using input means 83 into the controller 80. A displacement amount (position information) of the stage 61 is fed back from the feeding mechanism 78 to the controller 80. Consequently, as mentioned above, the stage 61 can be positioned by the control command from the controller 80. As shown in FIGS. 8 and 9A, the stage 72 is moved to the right end by driving the driving source 75 on the basis of the control command from the controller 80 and the member 62 is positioned to the right end of the group of the thin semiconductor chips in one row at the end in the x-axis direction. After that, the supporting member 68 is lifted by driving the driving source 71 by a control command from the controller, the back face of the adhesive sheet 50 is pushed up by the member 62 with the pressure of the spring member 66, and the tension ft is given to the adhesive sheet 50 as shown in FIG. 3. Subsequently, on the basis of a control command from the controller 80, the stage 72 is moved from the right end by driving the driving source 75 to the state shown in FIG. 9B and is further moved to the left end to the state shown in FIG. 9C and FIG. 13B. Subsequently, the stage 72 is moved from the left end to the state shown in FIG. 9D and is further moved to the right end, thereby reciprocating the stage 72. Further, as shown in FIG. 10A, the supporting member 68 is lowered, thereby peeling off the group of the thin semiconductor chips in one row at the end in the x-axis direction from the adhesive sheet 50 and placing it in the same position. In this case, it is unnecessary to reciprocate the stage 72. In order to certainly peel off the adhesive sheet 50, however, it is preferable to reciprocate the stage 72. In such a state, as shown in FIG. 10B, the vacuum collet 101 is lowered by driving a drive source 102 such as a cylinder by a control command from the controller 80, the group 20 of the thin semiconductor chips in one row is adsorbed by the vacuum collet 101 and is lifted, thereby separating the group 20 of the thin semiconductor chips in one row from the adhesive sheet 50 as shown in FIG. 10C. The vacuum collet 101 conveys the adsorbed group 20 of the thin semiconductor chips in one row to the separation conveyer part 200 by a feeding mechanism 109 by driving a drive source 108 in response to a control command from the controller 80 as shown in FIG. 11A, puts the group 20 of the semiconductor chips on a conveyer 201 as shown in FIG. 11B, and is returned to the separation mechanism part 100.

Figure 13B:
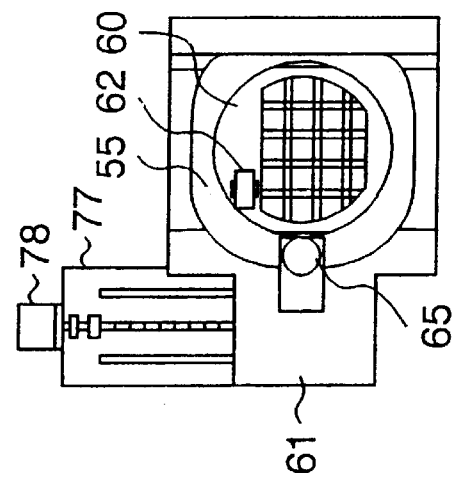
Figure 13C:
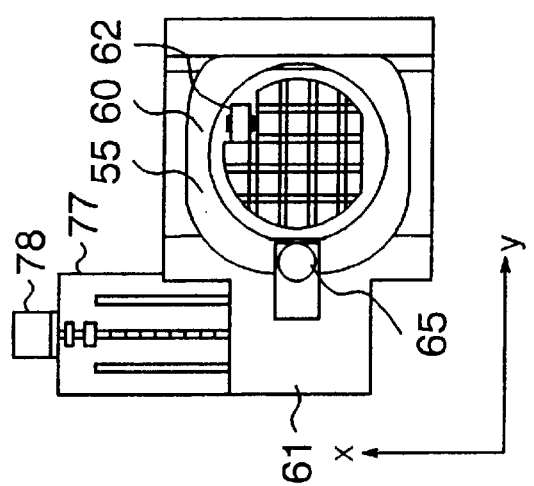

Subsequently, on the basis of the control command from the controller 80, the stage 61 is moved by an amount corresponding to the pitch of the group of the thin semiconductor chips of one row and the movement of the stage 72 and the supporting member 68 is controlled, thereby peeling off the group 20 of thin semiconductor chips of the next row from the adhesive sheet 50 by the member 62 and separating from the adhesive sheet 50 by the vacuum of the vacuum collet 101 as shown in FIG. 13C.

By repeating the above operation for the groups of the thin semiconductor chips of all of the rows obtained by dicing the semiconductor wafer 40, the groups of the thin semiconductor chips of all of the rows can be peeled from the adhesive sheet 50, separated from the adhesive sheet 50 by the adsorbing operation of the vacuum collet 101, conveyed to the separation conveyer part 200, and put on the conveyer 201.

In the first embodiment, the forces P for pushing up the adhesive sheet by the member 62 in the peripheral and central parts including variations in the tension of the adhesive sheet 50 are preset by theory, experiment, or the like with respect to the groups of the thin semiconductor chips of all of the rows, and the set pushing force P is inputted by using the input means 83 or the like and is stored in the storage 81 or the like. By inputting the conditions regarding the adhesive sheet by using the input means 83 or the like, the forces P for pushing the adhesive sheet by the member 62 in the peripheral and central parts can be calculated by the CPU in the controller 80 and stored in the storage 81 or the like with respect to the groups of the thin semiconductor chips in all of the rows.

By controlling the vertical movement of the supporting member 68 by driving the drive source 71 on the basis of the preset pushing forces P in the peripheral and central parts stored in the storage 81 or the like, the controller 80 can properly set the force P for pushing the adhesive sheet by the member 62 both in the peripheral and central parts with respect to the groups of the thin semiconductor chips in all of the rows in accordance with a change in flexibility (for example, a compression amount) of the spring member 66. The groups of the thin semiconductor chips in all of the rows can be, therefore, certainly peeled off without damaging the adhesive sheet 50.

A vacuum collet part 120 constructed by a conveying mechanism will be described with reference to FIGS. 9, 10, and 11. Reference numeral 109 indicates the base in which a supporting member 103 is movably guided and supported between the separation mechanism part 100 and the separation conveyer part 200. Reference numeral 108 denotes the drive source such as a motor for moving the supporting member 103 between the separation mechanism part 100 and the separation conveyer part 200 by a feeding mechanism. On the supporting member 103, a movable block 105 is supported so as to be movable in the vertical direction, the drive source 102 such as a cylinder is mounted, an output of the drive source 102 is connected to the movable block 105 and the movable block 105 is moved vertically. The movable block 105 supports the vacuum collet 101 via a spring member 106 so as to be vertically movable. The vacuum collet 101 is constructed in such a manner that holes for attraction are opened in accordance with the group of the semiconductor chips in a row peeled from the adhesive sheet 50 and placed, even if the holes are not closed by the semiconductor chips, the semiconductor chips are attracted by the flow of air so as to assure the attraction by the other holes. With such a construction, even if the number of chips of the group of the semiconductor chips in one row is changed, the attraction is not reduced and the group of the semiconductor chips in one row can be adsorbed by the vacuum collet 101 at once. As shown in FIG. 10B, the movable block 105 and also the vacuum collet 101 are descended by driving the drive source 102 such as a cylinder in response to a control command from the controller 80. By contracting the spring member 106, the end of the vacuum collet 101 is allowed to contact with or come close with a small gap the group 20 of the thin semiconductor chips in one row peeled from the adhesive sheet 50 and placed and the group 20 of thin semiconductor chips in the row is adsorbed by the vacuum collet 101. The vacuum collet 101 is lifted with the rise of the movable block 105. In this manner, the group 20 of thin semiconductor chips in one row is separated from the adhesive sheet 50 as shown in FIG. 10C. As shown in FIG. 11A, the vacuum collet 101 which vacuums the group 20 of thin semiconductor chips in one row is moved together with the supporting member 103 to the separation conveyer part 200 by the feeding mechanism 109 by driving the drive source 108 in response to the control command from the controller 80. After that, the drive source 102 such as a cylinder is driven by a control command from the controller 80 to descend the movable block 105 and the vacuum collet 101. The spring member 106 is compressed, the group 20 of thin semiconductor chips in one row adsorbed by the end of the vacuum collet 101 is come into contact with the conveyer, and the vacuum of the vacuum collet 101 is canceled, thereby enabling the group 20 of thin semiconductor chips in one row to be put on the conveyer 201 as shown in FIG. 11B.

A second embodiment in which the vacuum collet 101 in the separation mechanism part 100 according to the invention is removed will be described. A point different from the first embodiment is such that the forces P for pushing up the adhesive sheet by the member 62 in both of the peripheral and central portions are controlled more accurately with respect to the groups of thin semiconductor chips in all of rows.

Reference numeral 84 denotes a pressure sensor attached to the supporting member 68, which optically or magnetically senses a displacement of the member 62, thereby sensing the pressure P for pushing up the adhesive sheet 50 by the member 62 via the spring member 66. The pressure sensor 84 can be constructed by a distortion gauge or the like and provided between the spring member 66 and the supporting member 68 so as to sense the pressure P for pushing up the adhesive sheet 50 by the member 62 via the spring member 66. It is also possible to construct in such a manner that the spring member 66 is removed from the member 62 and the pressure sensor 84 is directly attached to the lower end of the member 62 so as to sense the pressure P. Reference numeral 85 denotes a displacement sensor attached on the stage 72, which optically or magnetically senses displacement of the member 62, thereby sensing flexibility (h) of the adhesive sheet 50. The reason why the flexibility (h) of the adhesive sheet 50 can be sensed by the displacement sensor 85 is because there is no fluctuation in distance between the stage 61 on which the work 60 is put and the stage 72. When the end of the member 62 is come into contact with the under face of the adhesive sheet 50 preliminarily attached to the metallic frame 55, the displacement sensor 85 senses it and the sensed position can be used as a reference position where there is no flexibility in the adhesive sheet 50. The displacement sensor 85 can be constructed by an air micro which is attached to the tip of the stage 72 and directly measures the flexibility near the back face of the adhesive sheet 50 to which the tip of the member 62 acts.

As mentioned above, when the member 62 is lifted by driving the drive source 72 with the pressure P for pushing up the adhesive sheet 50 by the member 62 sensed by the pressure sensor 84 and the flexibility (h) of the adhesive sheet 50 sensed by the displacement sensor 85, thereby pushing up the back face of the adhesive sheet 50, it can be controlled so that the tension ft applied on the adhesive sheet 50 does not exceed the elastic limit and the separation force f t sin θ exceeds the adhesive strength F in the whole area of the adhesive sheet 50. As a result, only by pushing up the member 62 against the back face of the adhesive sheet 50 and moving the member 62 in the y-axis direction, the group of thin semiconductor chips in a row can be easily peeled off and placed in the same position without being cracked or damaged. In case of the embodiment, when the back face of the adhesive sheet 50 is pushed up by lifting the member 62 by driving the drive source 71, even if the tension ft applied on the adhesive sheet 50 exceeds the elastic limit and the adhesive sheet 50 is slightly slackened, the force P for pushing up the back face of the adhesive sheet 50 by the member 62 can be controlled in accordance with the slack of the adhesive sheet. Consequently, the group of thin semiconductor chips in one row can be easily peeled from the adhesive sheet 50 by applying a desired tension to the adhesive sheet 50 without being cracked or damaged.

The controller 80 can obtain the information (11, 12) that the stage 72 is displaced in the y-axis direction and the member 62 is positioned in the y-axis direction from a displacement sensor such as encoder provided for the drive source 75. The controller 80 can also obtain the information (13+W/2, 14+W/2) that the stage 61 is displaced in the x-axis direction and the member 62 is positioned in the x-axis direction from a displacement sensor such as an encoder provided for the drive source 78.

From the above, the controller 80 can calculate the angles $\theta 1$ and $\theta 2$ between the adhesive sheet 50 and the under face 64 of the metallic frame 55 shown in FIG. 3 from the positional information (11, 12) in the y-axis direction of the member 62 obtained from the displacement sensor such as an encoder provided for the drive source 75 and the flexibility (h) of the adhesive sheet 50 sensed by the displacement sensor 85. Further, since the pressure P for pushing up the adhesive sheet 50 by the member 62 can be sensed by the pressure sensor 84, the tension ft acting on the adhesive sheet 50 can be calculated from (formula 1).

Thus, the controller 80 controls the drive source 71 so that the tension ft applied on the adhesive sheet 50 is within the elastic limit and the peeling force f t sin $\theta$ sufficiently exceeds the adhesive strength F in the whole area of the adhesive sheet 50, only by pushing up the back face of the adhesive sheet 50 by the member 62 and moving the member 62 in the y-axis direction, the group of thin semiconductor chips in a row can be easily peeled off and placed in the same place without cracking or damaging them.

The spring member 66 in the second embodiment as mentioned above can also play a role to soften the impact when the tension is applied to the adhesive sheet 50 by pushing up the member 62. The stages 61 and 72 are controlled in a manner similar to the first embodiment as shown in FIG. 13.

Figure 8:
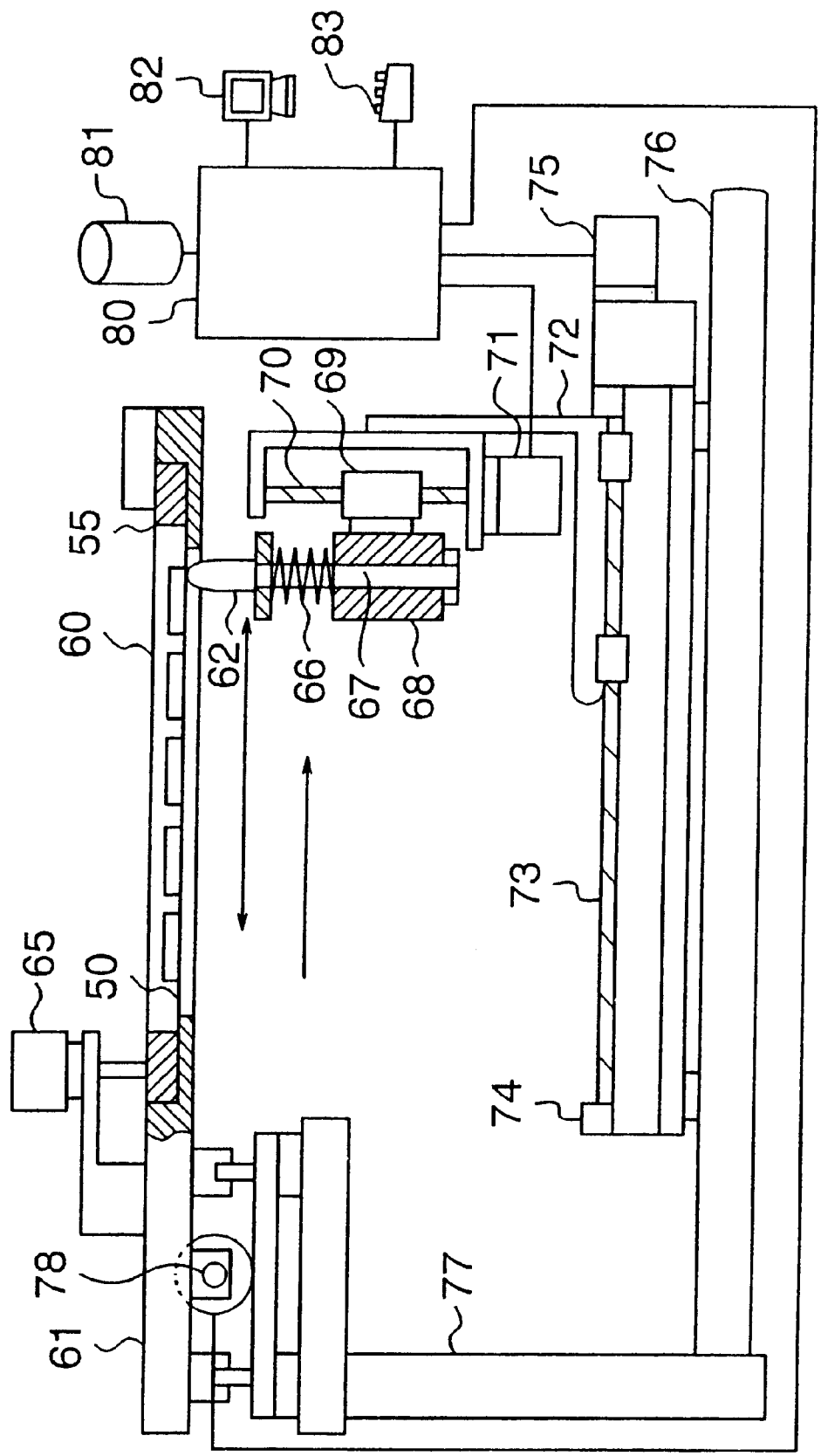
FIG. 8 is a front view showing a schematic construction of a first embodiment of the separation mechanism part according to the invention.

That is, as shown in FIG. 8, the stage 72 is moved to the right end by driving the drive source 75 on the basis of the control command from the controller 80, thereby positioning the member 62 to the right end of the group of thin semiconductor chips in one row at the end in the x-axis direction. After that, by the control command from the controller 80, the supporting member 68 is lifted by driving the drive source 71 and the back face of the adhesive sheet 50 is pushed up by the member 62 with the pressure of the spring member 66, thereby applying the tension ft to the adhesive sheet 50 as shown in FIG. 3. Subsequently, on the basis of the control command from the controller 80, the drive source 75 is driven to reciprocate the stage 72 by moving from the right end to the left end as shown in FIG. 13B and subsequently from the left end to the right end. Consequently, the group of thin semiconductor chips in one row at the end in the x-axis direction is peeled from the adhesive sheet 50 and placed in the same position. In such a state, the vacuum collet 101 descends as shown in FIG. 10B, vacuums the group 20 of thin semiconductor chips in one row and is lifted as shown in FIG. 10C, thereby separating the group 20 of thin semiconductor chips in one row from the adhesive sheet 50. As shown in FIGS. 11A and B, the vacuum collet 101 conveys the adsorbed group 20 of thin semiconductor chips in one row to the separation conveyer part 200 and puts them on the conveyer 201, and is returned to the separation mechanism part 100.

Subsequently, on the basis of the control command from the controller 80, the stage 61 is moved by an amount corresponding to the pitch of the group of thin semiconductor chips in one row, the movement of the stage 72 and the supporting member 68 is controlled, and the group 20 of thin semiconductor chips in the next row is peeled from the adhesive sheet 50 by the member 62 as shown in FIG. 13C and is separated from the adhesive sheet 50 by the adsorbing operation of the vacuum collet 101.

By repeating the above operation with respect to the groups of thin semiconductor chips in all of the rows obtained by dicing the semiconductor wafer 40, the groups of thin semiconductor chips in all of the rows are peeled from the adhesive sheet 50 in serial order, separated from the adhesive sheet 50 by the adsorbing operation of the vacuum collet 101, conveyed to the separation conveyer part 200, and placed on the conveyer 201.

Figure 14:
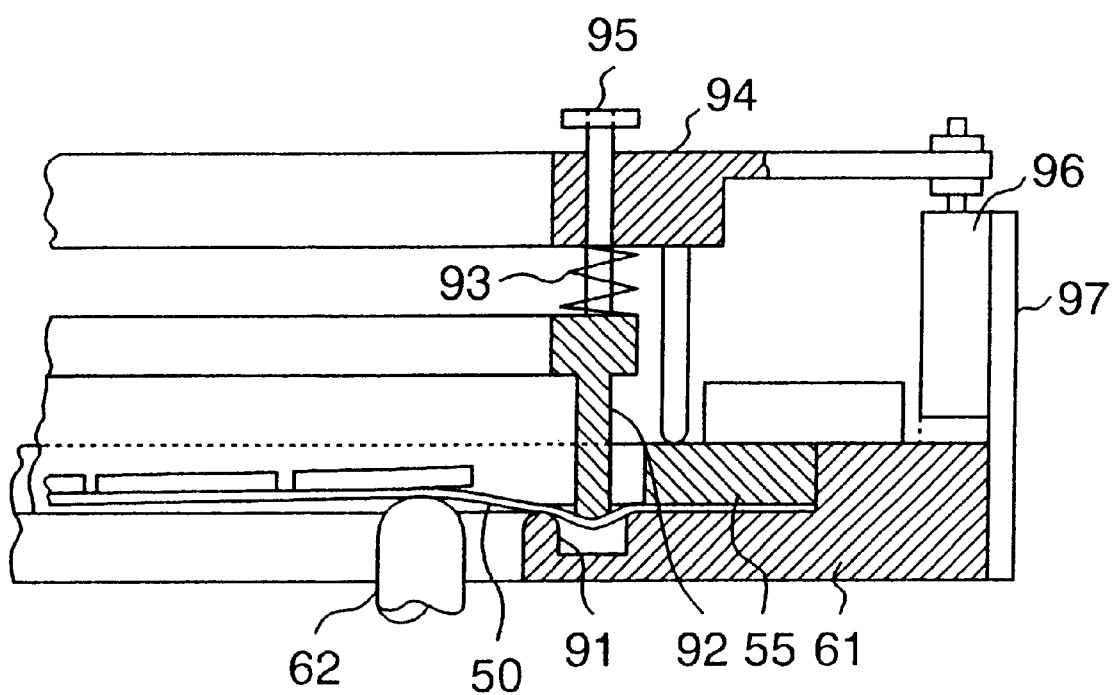
FIG. 14 is a front cross section showing a schematic construction of a third embodiment of the separation mechanism part according to the invention.

A third embodiment in which the vacuum collet 101 is removed from the separation mechanism part 100 according to the invention will be described with reference to FIG. 14. According to the third embodiment, the adhesive sheet 50 is adhered to the metallic frame 55 and, after that, the semiconductor wafer 40 is diced into the semiconductor chips 10, and variations in the tension of the adhesive sheet 50 adhered to the metallic frame 55 occurring until the work 60 in which the adhesion of the semiconductor chips 10 to the adhesive sheet 50 is weakened by the UV irradiation is loaded onto the stage 61 are suppressed. Reference numeral 91 denotes a ring-shaped groove formed in the stage 61 along the inner periphery of the metallic frame 55 of the adhesive sheet 50 adhered to the metallic frame 55; 92 a ring-shaped pressing member using a pressure of a spring member 93; 95 a shaft having a stopper formed at the upper end of the ring-shaped pressing member 92; 94 a supporting member for supporting the ring-shaped pressing member 92 so as to be movable in the vertical direction and for supporting the shaft 95 so as to be vertically slidable; and 96 a cylinder attached to the stage 61 by an attaching member 97, which connects an output to the supporting member 94 and allows the ring-shaped pressing member 92 to escape upward so as to set the work 60 onto the stage 61.

With the construction, the back face of the outer peripheral part of the adhesive sheet 50 adhered to the metallic frame 55 in the work 60 put on the stage is supported by both ends of the ring-shaped groove 91. The ring-shaped pressing member 92 is pressed from the surface side of the peripheral part of the adhesive sheet 50 with the pressure given by the spring member 93 and the adhesive sheet 50 is stretched toward the inside of the groove 91, thereby enabling a predetermined tension to be given to the adhesive sheet 50. The spring member 93 with little compressing fluctuation by the displacement is required to be used. A part supporting the back face of the adhesive sheet 50 formed in the ring-shaped groove 91 is required to be formed in a circular shape in cross section so as to reduce the frictional resistance. If the frictional resistance is not reduced only by forming the part supporting the back face of the adhesive sheet 50 formed in the ring-shaped groove 91 in a circular shape in cross section, it is desired to cover the surface with a material having a little frictional resistance.

As mentioned above, according to the third embodiment, even if there is variation in tension of the adhesive sheet 50 adhered to the metallic frame 55 in the state of the work 60, only by placing the work 60 on the stage 61, the ring-shaped pressing member 92 is descended together with the supporting member 94 by the cylinder 96 in response to the drive command from the controller 80, the ring-shaped pressing member 92 is pressed by the pressure given the spring member 93, and the adhesive sheet 50 is stretched into the groove 91, thereby enabling a predetermined tension to be given to the adhesive sheet 50.

Consequently, as described in the first embodiment, the drive source 71 is driven in response to the drive command from the controller 80, the supporting member 68 is raised by a desired displacement amount, and the back face of the adhesive sheet 50 is pushed up by the member 62 with the pressure given the spring member 66 by a desired displacement amount (h), thereby enabling the tension ft to be given to the adhesive sheet 50 without detecting the pressing force P as shown in FIG. 3.

Finally, when the work having only the adhesive sheet from which all of the semiconductor chips are taken out is detached from the stage 61, it is necessary to lift and escape the ring-shaped pressing member 92 together with the supporting member 94 by the cylinder 96 on the basis of the drive command from the controller 80.

Figure 15A:
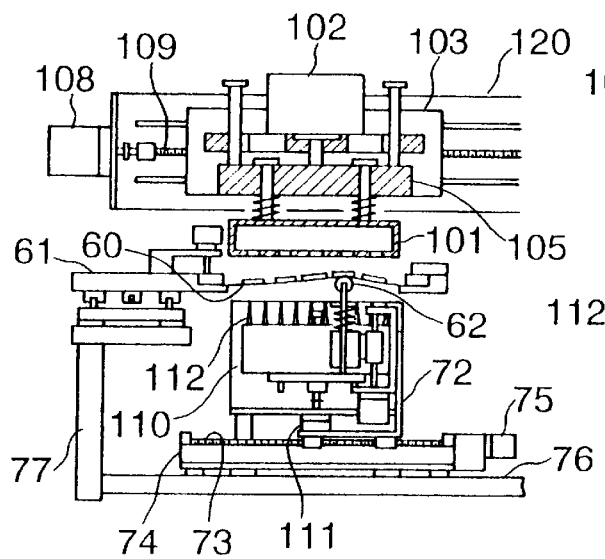
FIGS. 15A to D are a front view showing a schematic construction and an operation process of a fourth embodiment of the separation mechanism part according to the invention.
Figure 15B:
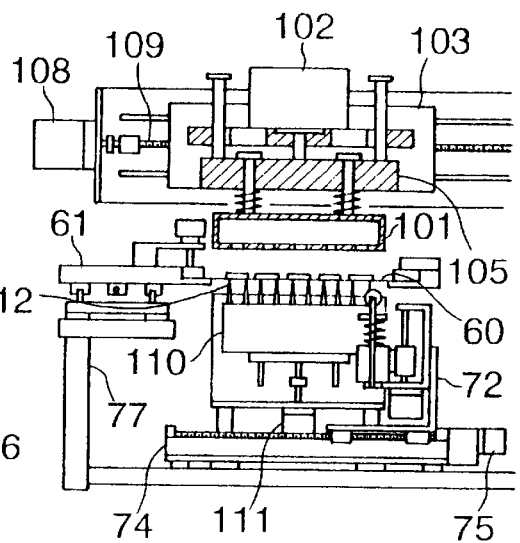
Figure 15C:
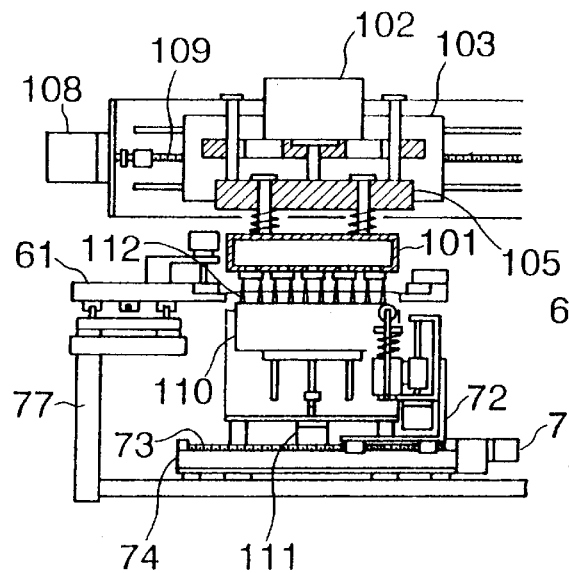
Figure 15D:
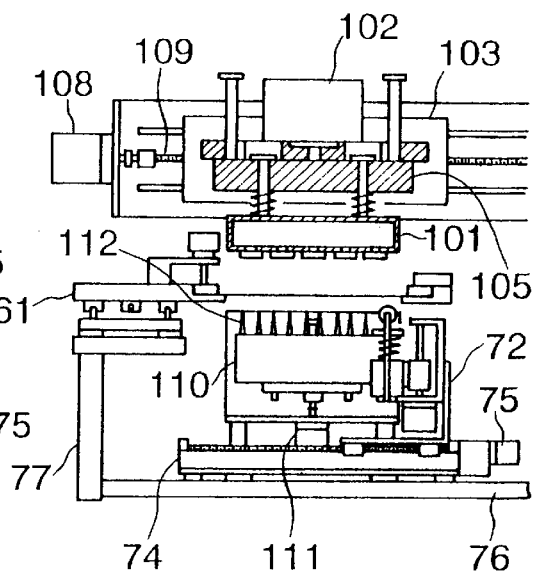

A fourth embodiment of the separation mechanism part 100 according to the invention will be described with reference to FIG. 15. The fourth embodiment is different from the first, second, and third embodiments with respect to the following point. By lifting a block 110 on which needles 112 are vertically provided in accordance with the group 20 of semiconductor chips in one row, the group 20 of semiconductor chips in one row peeled from the adhesive sheet 50 and placed in the same position in the first and second embodiments are separated from the adhesive sheet 50 by lifting the group 20 of semiconductor chips in only one row by the tips of the needles 112 via the adhesive sheet 50 from a state shown in FIG. 15B to a state shown in FIG. 15C and is allowed to contact with the vacuum collet 101 which faces from the above and is adsorbed by the vacuum collet 101. That is, the block 110 on which the needles 112 are vertically formed in accordance with the group 20 of semiconductor chips in one row is supported so as to be movable in the vertical direction on the stage 74. The block 110 is connected to the output of a drive source 111 mounted on the stage 74 and the drive source 111 is driven on the basis of the control/command from the controller 80, thereby enabling the block 110 to be moved vertically. Consequently, as shown in FIG. 15A, in a manner similar to the first and second embodiments, by reciprocating the member 62 in the y-axis direction in a state where the member 62 is lifted to push up the adhesive sheet 50 in the work 60, the group 20 of semiconductor chips in one row is peeled from the adhesive sheet 50 and is placed in the same position. After that, by driving the drive source 111 on the basis of the control command from the controller 80, the block 110 is lifted. The group 20 of semiconductor chips in one row peeled by the needles 112 vertically formed on the block 110 is slightly lifted and separated from the adhesive sheet 50. The movable block 105 is descended by driving the drive source 102 such as a cylinder by the control command from the controller 80 and the vacuum collet 101 is also descended. The spring member 106 is contracted to make the end of the vacuum collet 101 come into contact with the group 20 of thin semiconductor chips in one row slightly apart from the adhesive sheet 50 and the group 20 of thin semiconductor chips in one row is adsorbed by the vacuum collet 101. By lifting the vacuum collet 101 with the rise of the movable block 105, a state shown in FIG. 15D is obtained. The operation after that is similar to that in the first embodiment as shown in FIGS. 11A and B.

According to the fourth embodiment, the group 20 of thin semiconductor chips in one row peeled from the adhesive sheet 50 and placed in the same position is further slightly lifted up by the needles 112. Consequently, even if there is a semiconductor chip which is not peeled from the adhesive sheet 50 by chance, it can be certainly peeled from the adhesive sheet 50 and adsorbed and lifted up by the vacuum collet 101. Since a separation force acts on a semiconductor chip which is not sill peeled from the adhesive sheet 50 even after adsorbed and lifted by the vacuum collet 101, the fourth embodiment can be sufficiently practically used also in the first and second embodiments.

A specific construction of a first embodiment of a whole system for dicing (cutting) a thin semiconductor wafer (semiconductor substrate) into thin semiconductor chips (semiconductor devices) and mounting the semiconductor chips onto a circuit board constructing an IC card or the like according to the invention will be described with reference to FIG. 16. Since the separation mechanism part 100 has been already described, the description is omitted here. The separation conveyer part 200 comprises the conveyer 201, a sensor 202, a sensor 203, a rotating member 208 with a nozzle, an image pickup means 209, and a conveying mechanism 230. The conveyer 201 is provided on a base 218 and conveys the group 20 of thin semiconductor chips (semiconductor devices) in a row which is to be conveyed and put by the vacuum collet 101 in the separation mechanism part 100. The sensor 202 senses a marked defective chip conveyed by the conveyer 201 and senses that a space in which the group 20 of thin semiconductor chips (semiconductor devices) is carried by the conveyer 201 and put by the vacuum collet 101 can be assured. The sensor 203 senses that the semiconductor chip conveyed by the conveyer 201 has come to the separation position. The rotating member 208 with a nozzle has: a discharging means constructed by a chute 206 and a housing container 207 to eject the defective semiconductor chip when the sensor 203 senses that the defective semiconductor chip sensed by the sensor 202 has come to the separation position; and a nozzle for attracting and inverting the non-defective semiconductor chips sensed by the sensor 203 and which is indexed by a drive source 220. The image pickup means 209 is provided for the rotating member 208 and measures the outer shape of the semiconductor chip 10 adsorbed by the nozzle which is expanded and contracted. The conveying mechanism 230 vacuums the semiconductor chips 10 adsorbed by the nozzle 216 expanding and contracted by a drive means such as a cam mechanism provided for the rotating member 208 and inverted by the index of the rotating member 208 and conveys the semiconductor chips 10 to the mounting mechanism part 300. The conveying mechanism 230 has a moving unit 210 which moves along a guide 212, a drive source 211 for moving the moving unit 210 via a feeding mechanism 213, and a block 215 with a vacuum nozzle to which the vacuum nozzle 216 is attached supported on the moving unit 210 so as to be movable in the vertical direction by a drive source 214 such as a cylinder. The sensors 202, 203, image pick means 209, drive source 217 for driving the conveyer 201, index drive source 220 of the rotating member 208, and drive sources 211 and 214 of the conveying mechanism 230 are connected to the controller 80. The controller 80 drives the various drive sources 217, 220, 211, and 214 in accordance with information obtained from the sensors 202, 203, the image pickup means 209, and the like.

Figure 18A:
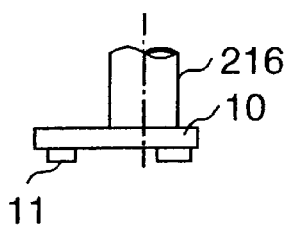
FIGS. 18A to D are a diagram for explaining calculation of the position of an electrode formed on a semiconductor chip by using a vacuum nozzle which is a reference on the semiconductor chip as a reference.
Figure 18C:
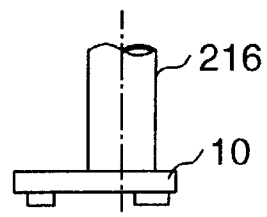
Figure 18B:
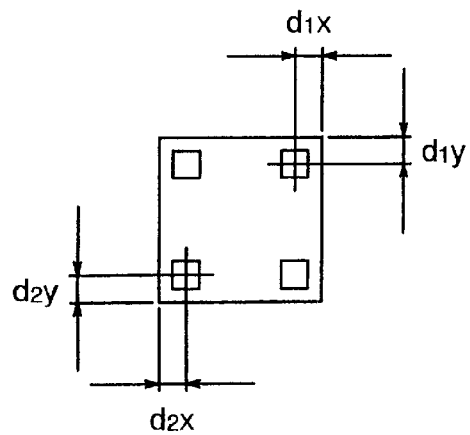
Figure 18D:
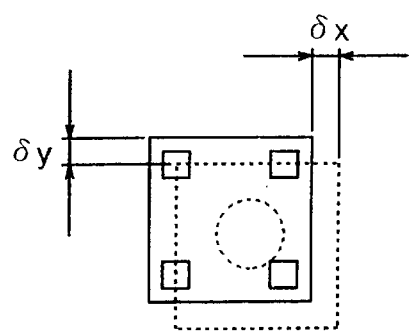

When it is sensed by the sensor 202 that the space for the group 20 of semiconductor chips is assured, therefore, the group 20 of semiconductor chips is conveyed from the separation mechanism part 100 and is put on the conveyer 201 by the vacuum collet 101. The marked defective semiconductor chip is detected by the sensor 202. When each of the semiconductor chips conveyed by the conveyer 201 and has come to the separation position is sensed by the sensor 203, the nozzle provided for the rotating member 208 to be indexed is extended and descended and vacuums the semiconductor chip which has come to the separation position. The outer shape of the semiconductor chip adsorbed by the nozzle when the rotating member 208 is indexed is measured by the image pickup means 209 and the information is inputted to the controller 80. Actually, the image pickup means 209 obtains an image of the side on which an electrode 11 is not formed of the semiconductor chip, so that information of only the outer shape is obtained. The semiconductor chip 10 is adsorbed by the vacuum nozzle 216 on the basis of the information. That is, as shown in FIGS. 18C and D, positional information ($\delta x$, $\delta y$) for the vacuum nozzle 216 shown by a chain line in FIG. 18D in the semiconductor chip 10 adsorbed by the vacuum nozzle 216 shown by a solid line is obtained from the information of only the outer shape measured by the image pickup means 209 and is inputted to the controller 80.

Further, the chip adsorbed by the nozzle of the rotating member 208 and inverted by the index of the rotating member 208 is adsorbed by the vacuum nozzle 216 in the conveying mechanism 230 and is carried to the mounting mechanism part 300.

In the mounting mechanism part 300, only by descending the vacuum nozzle 216, the semiconductor chip adsorbed by the vacuum nozzle 216 and conveyed by the conveying mechanism 230 is put on X-Y stages 302 and 303 and can be mounted on the circuit board 30 constructing an IC card or the like positioned by the X-Y stages 302 and 303. Especially, in case of mounting the semiconductor chip on the circuit board 30, it is necessary to position and mount the electrode 11 formed on the semiconductor chip and the electrode formed on the circuit board 30. An image pickup means 306 is installed in a passage through which the semiconductor chip adsorbed by the vacuum nozzle 216 is conveyed by the conveying mechanism 230, picks up the image of the side on which the electrode 11 is formed in the semiconductor chip, measures the positions (d1x, d1y) (d2x, d2y) of the electrode (pad) 11 by using the outer shape as a reference, and inputs the data into the controller 80. The semiconductor chip 10 is conveyed by a determined distance to the mounting mechanism part 300 by the conveying mechanism 230 by using the vacuum nozzle 216 as a reference. On the other hand, in the mounting mechanism part 300, the position information of each electrode 11 formed on the semiconductor chip using the vacuum nozzle 216 as a reference is necessary. The position information of each electrode 11 can be calculated on the basis of the position information (d1x, d1y) (d2x, d2y) of each electrode (pad) 11 obtained by using the outer shape picked up the by the pickup means 306 as a reference and outer shape position information ($\delta x$, $\delta y$) picked up by the image pickup means 209 and obtained by using the vacuum nozzle as a reference. The position information of the electrode 11 preliminarily formed on the semiconductor chip and the electrode formed on the circuit board to be connected is inputted to the controller 80 and is stored into, for example, the storage 81. When the semiconductor chip is mounted on the circuit board 30, the controller 80 positions the X-Y stages 302 and 303 by driving drive sources 304 and 305 which drive the X-Y stages 302 and 303 on the basis of the position information of the electrode formed on the circuit board and the calculated position information of each electrode 11 formed on the semiconductor chip obtained by using the vacuum nozzle 216 as a reference, thereby enabling the electrode formed on the circuit board and the electrode formed on the semiconductor chip to be connected by using a bonding material or the like.

Figure 17A:
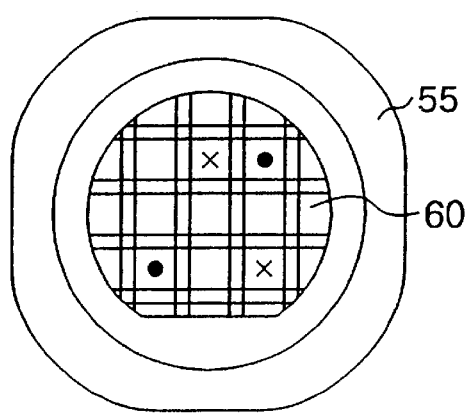
FIGS. 17A to C are a diagram showing defective semiconductor chips in a coordinate system set on the semiconductor wafer in the work according to the invention.
Figure 17C:
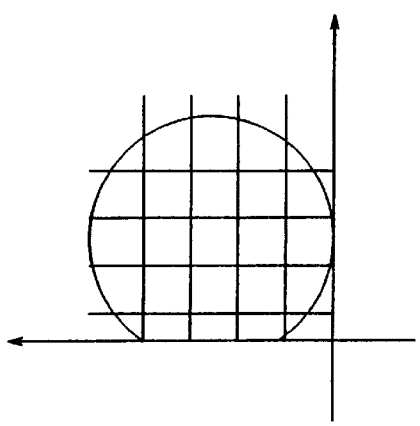
Figure 17B:

Although the case where the defective semiconductor chip is sensed by the sensor 202 in the separation conveyer part 200 has been described, since the position information in the semiconductor wafer coordinates (shown in FIG. 17C) of the defective semiconductor chip has been sensed by the test as shown in FIGS. 17A and B, if the position information is inputted to the controller 80, the defective semiconductor chip can be removed in the separation position by the ejecting means 207, 207.

Although the case where the separation mechanism part 100 is arranged in the vertical direction has been described in the embodiment, a plurality of the separation mechanism part 100 can be arranged also in the lateral direction. In this case, it is necessary to add a mechanism which can change operation for conveying the vacuum collet 101 in the vacuum collet part 120 constructed by a conveying mechanism from the vertical direction to the lateral direction. When the separation mechanism part 100 is arranged laterally, the conveying operation of the vacuum collet 101 shown by 103 in FIG. 1 to the separation conveyer part 200 has to be performed in both of the vertical and lateral directions. By arranging the separation mechanism part 100 laterally, however, a plurality of separation mechanism parts 100 can be arranged side by side. Consequently, the group 20 of semiconductor chips in rows can be supplied more to the separation conveyer part 200.

A second embodiment of the whole system for dicing (cutting) a thin semiconductor wafer (semiconductor substrate) into thin semiconductor chips (semiconductor devices) and mounting the semiconductor chips onto a circuit board constructing an IC card or the like according to the invention will be described with reference to FIGS. 19 to 29. A part largely different from the first embodiment is a separation mechanism part 100'. The operation of the separation mechanism part (separation means) 100' will be described with reference to FIG. 19. As shown in FIG. 19A, the whole surface on which the electrode 11 is formed of the semiconductor chip obtained by the dicing operation is strongly held by a chuck 150 for the work 60. The chuck 150 has a chuck face member 151 in which grooves 152 for vacuum adsorption are formed on the surface in correspondence to the semiconductor chips 10 and the grooves 152 are communicated with a vacuum source 153. It is not always necessary to construct the chuck 150 by a vacuum chuck. Any member can be used as long as the semiconductor chips can be strongly held. It can be also constructed by a magnet chuck or a frozen chuck (by a deep-freezing process which deep-freezes water on the surface of the chuck, the group of the semiconductor chips is fixed and it is removable by an unfreezing process). The adhesive sheet near the inner periphery of the metallic frame 55 for the work 60 which is strongly held by the chuck 150 is diced by rotating a cutter 155 and the metallic frame 55 is cut off from the adhesive sheet 50.

As shown in FIG. 19B, the chuck 150 and a clamp means 160 constructed by a pair of clamp rollers are made relatively close to each other and one end of the adhesive sheet 50 from which the metallic frame 55 is cut is clamped by the clamp means 160 made of the pair of clamp rollers.

Subsequently, while relatively moving the chuck 150 and the clamp means 160, the whole clamp means 160 is turned by 180° around an axis 161 as a center as shown by the arrow 162. As shown in FIG. 19C, the end of the adhesive sheet 50 is lifted upward.

By further relatively moving the chuck 150 and the clamp means 160, as shown in FIG. 19D, the adhesive sheet 50 adhered with the adhesive strength which is remarkably deteriorated by the UV irradiation to the group of the thin semiconductor chips is pulled laterally and is peeled from the group of thin semiconductor chips held by the chuck 150 without cracking the group of thin semiconductor chips. In this embodiment as well, as the adhesive sheet is peeled from the group of the thin semiconductor chips by the pulling force acting on the adhesive sheet, the adhesive sheet is peeled from one end of the semiconductor chip to the other end. Consequently, the adhesive sheet 50 can be peeled off without cracking and damaging any of the thin semiconductor chips held by the chuck 50. Further, when the direction of peeling the thin semiconductor chips 10 from the adhesive sheet 50 is set from the corner of the semiconductor chip, the adhesive sheet 50 can be peeled with weaker force.

Figure 20A:
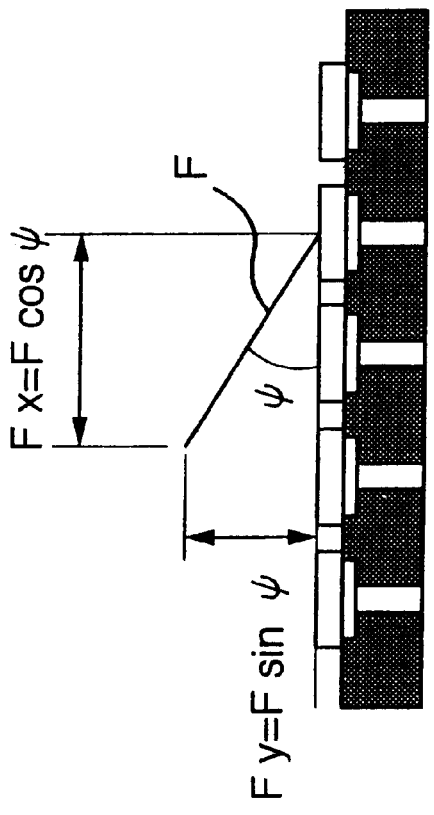
FIGS. 20A and B are a diagram showing the relation between the direction angle V of the pulling force F which acts against the surface of the semiconductor chips and the forces Fx and Fy which act to the semiconductor chips when peeled from the group of thin semiconductor chips by the pulling force F acting on the adhesive sheet in a second embodiment.
Figure 20B:
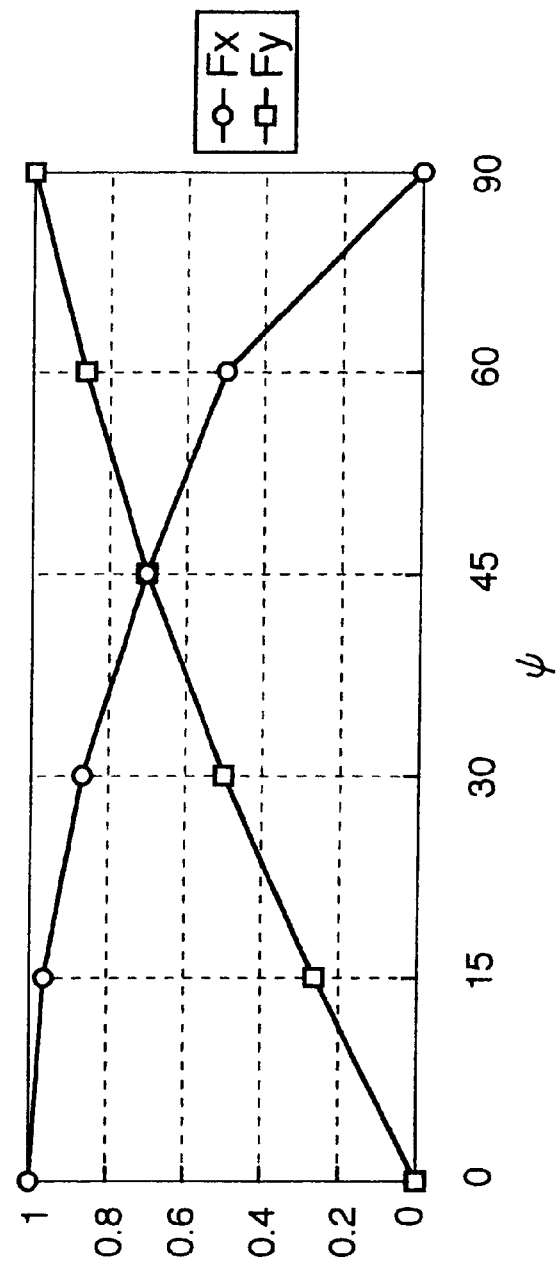

That is, in the second embodiment, when the adhesive sheet 50 is peeled from the group of thin semiconductor chips 10 by the pulling force F which acts on the adhesive sheet 50, the relation of an angle ψ of the acting direction of the pulling force F against the surface of the semiconductor chips and the forces Fx and Fy is shown in FIGS. 20A and B. Since the pulling force Fx is in the approximate relation to Fx=F cos ψ, a bigger pulling force will be obtained if ψ is smaller and consequently peeling the adhesive sheet 50 from the group of thin semiconductor chips 10 becomes easier. On the other hand, the force F which is against the holding force of the semiconductor chips 10 to the chuck 150 will be smaller if ψ becomes smaller. So the chuck 150 needs not have a very big holding force of and it is possible to decrease the possibility to crack the thin semiconductor chips 10.

Figure 21A:
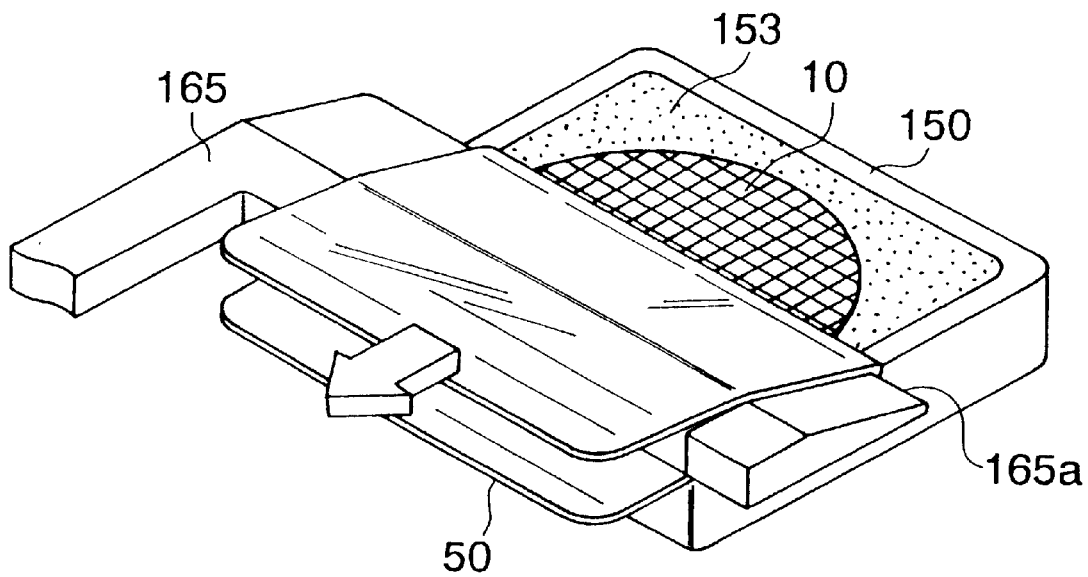
FIGS. 21A and B are a perspective view showing a state in which the adhesive sheet is peeled from a group of the semiconductor chips by using a wedge-shaped angle fixing jig for peeling in a second embodiment.
Figure 23A:
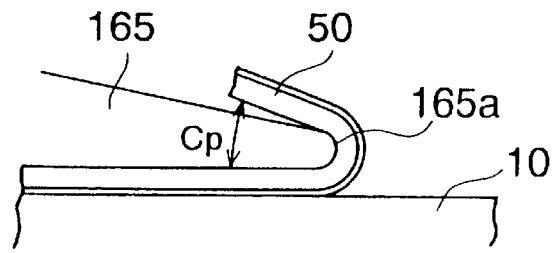
FIGS. 23A to C are an enlarged view showing a state in which the adhesive sheet is peeled from semiconductor chips, forming the bending part of the adhesive sheet by using a wedge-shaped peeling angle fixing jig or other means.

Thus, in order to have and assure an angle ψ of acting direction of the pulling force F as small as possible, a wedge-shaped peeling angle fixing jig 165 is used as shown in FIGS. 21A and B. The wedge-shaped peeling angle fixing jig 165 has roles of assuring the peeling angle ψ and focusing the peeling force by justifying a peeling location linearly against the group of the diced thin semiconductor chips. A top end 165a of the wedge-shaped peeling angle fixing jig 165, as shown in FIG. 23A, prevents the semiconductor chips 10 from cracking by avoiding the peeling force focusing at one point and forming the predetermined curved face (approximately 0.5 to 2.0 mm in radius). With the smaller radius of the curved face, it is easy to peel since the peeling force is focused. As a matter of course, with the thinner adhesive sheet, the smaller is the radius of the curved face, thus the peeling force is focused.

Figure 22A:
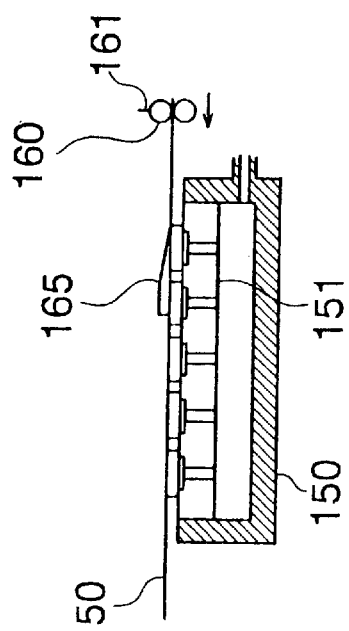
FIGS. 22A to D are a diagram explaining the principle of the separation mechanism part when a wedge-shaped peeling angle fixing jig in a second embodiment of the whole system is used.
Figure 22B:
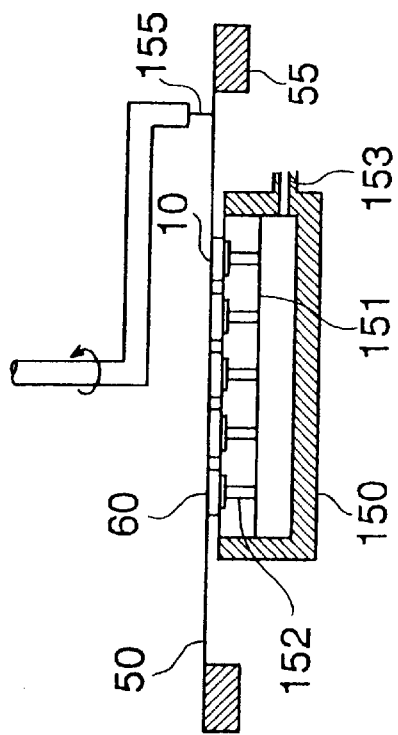
Figure 22C:
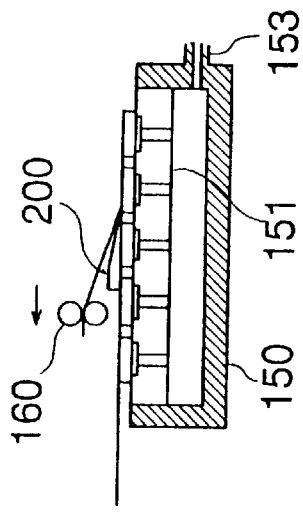
Figure 22D:
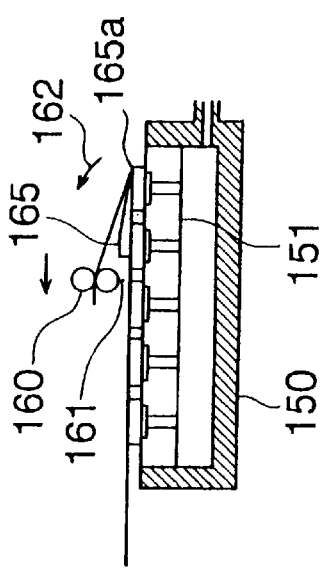

Subsequently, the separation mechanism part 100' (separating means) using the wedge-shaped peeling angle fixing jig 165 will be explained with reference to FIG. 22. Fundamentally, FIGS. 22A and B is the same to FIGS. 19A and B. As shown in FIG. 22B, the peeling angle fixing jig 165 is located in the right end to be close to the surface of the adhesive sheet 50. While relatively moving the chuck 150 and the clamp means 160, the whole clamp means is turned about an axis 161 by 180° as shown by the arrow 162. As shown in FIG. 22C, the end of the adhesive sheet 50 is lifted upward and bent at the top end 165a of the peeling angle fixing jig. By giving the pulling force F to an adhesive tape 50 with the clamp means 160, and focusing the peeling force of the adhesive tape at the curved surface formed at the top end 165a of the peeling angle fixing jig 165 while moving the whole clamp means 160 at the approximately double moving speed of the peeling angle fixing jig, the adhesive sheet 50 is peeled in serial order from each end of the semiconductor chips 10. Thus, by connecting the output force of the torque motor to one of the rollers of the clamp means 160 and giving a desired rotation torque, the pulling force F is given to the adhesive sheet 50. Therefore, a moving speed of the whole clamp means 160 may be approximately double the speed of peeling angle fixing jig 165.

As explained above, by using the peeling angle fixing jig 165, it is possible to assure the peeling angle ψ, to justify a peeling location linearly against the group of the diced thin semiconductor chips, to focus the peeling force, and to peel the adhesive sheet 50 smoothly without cracking each thin semiconductor chip.

Figure 23B:
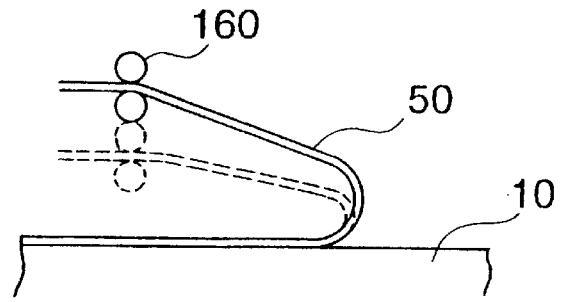

Though the embodiment utilizing the peeling angle fixing jig 165 is mentioned, without using the jig 165 as shown in FIG. 23B, obviously it is possible to use a method for peeling while forming a bending shape of the bending part only by changing the height between the clamp means 160 and the adhesive sheet with the use of bending force of the adhesive sheet.

Figure 21B:
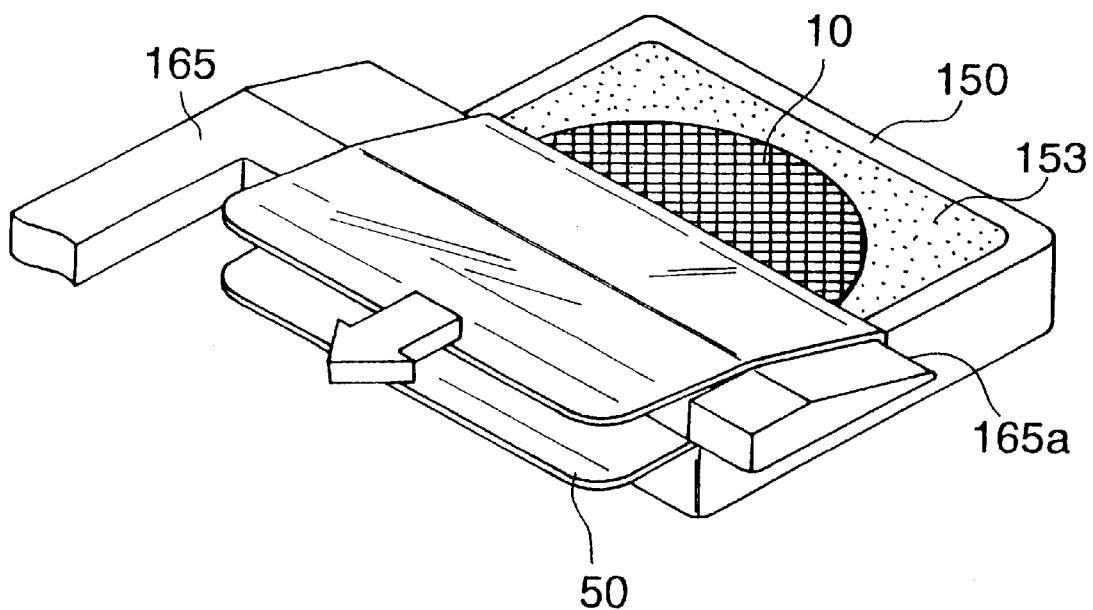

As for the directions of peeling the adhesive sheet 50 against the group of the diced semiconductor chips, there are the direction in which the semiconductor chips are arranged as shown in FIG. 21A, and the direction in which the plane surface tilts against the direction of semiconductor chips arranged as shown in FIG. 21B. Since in the case shown in FIG. 21B, the adhesive sheet begins to be peeled from the corner against each conductor chip, it is supposed that it is easier to be peeled than the case shown in FIG. 21A.

In the chuck 150, as shown in FIGS. 21A and B, if a porous absorptive plate 153 is provided on the absorptive surface, there is no need to fill absorptive holes except those for the group of the semiconductor chips and to adjust an arrangement of absorptive holes for the semiconductor chips. However, if the porous absorptive plate 153 is used, the absorptive force will be lowered.

Figure 24:
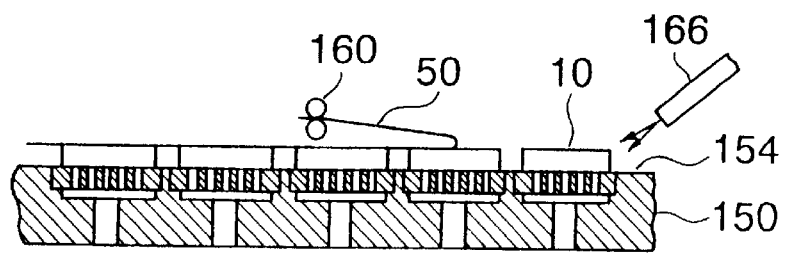
FIG. 24 is a view showing that a surface of a chuck is coated with a fluorine resin film.
Figure 25A:
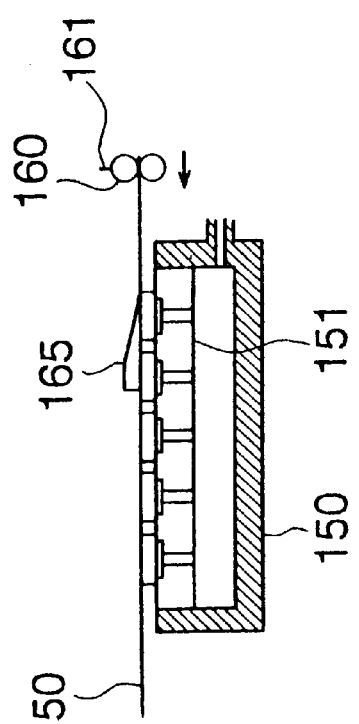
FIGS. 25A to D are a diagram explaining the principle of the separation mechanism part when a row of the semiconductor chips is pressed by a pressing means to follow the peeling shape fixing jig shown in FIG. 22.
Figure 25B:
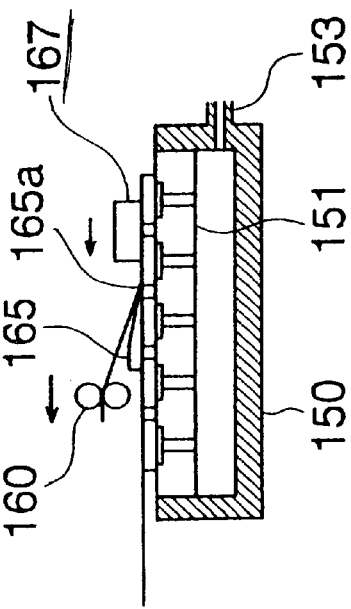
Figure 25C:
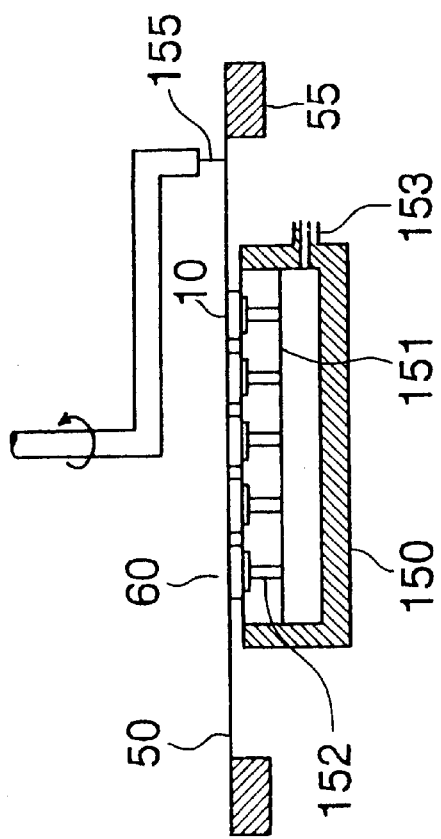
Figure 25D:
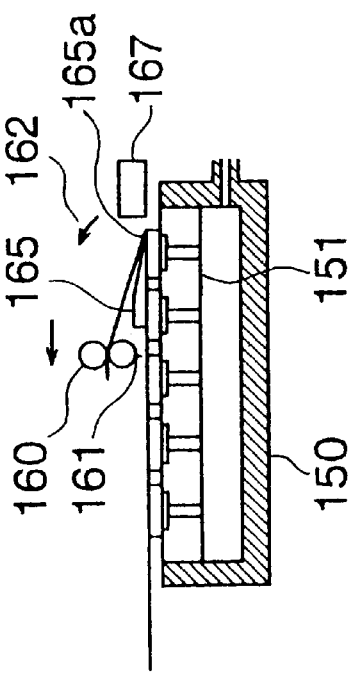

In the chuck 150, as shown in FIG. 24, by applying a fluorine resin film on the adsorptive surface provided a plurality of pinhole-shaped adsorptive holes, it is possible not to damage a circuit surface since the adsorptive force can be assured as well as the circuit surface formed electrodes or the like of the semiconductor chips is adsorbed by assuring the holding force to some extent. However, a surface of the fluorine resin film bears the electrical charge, at times it is neutralized by ion blowing using an ion ejection means 166 and thus gives no influence to the semiconductor chips.

As shown in FIG. 25, by pressing a row of the semiconductor chips from which the adhesive sheet 50 is being peeled following right after the top end 165a of the peeling angle fixing jig 165, it is possible to hold the group of the semiconductor chips from which the adhesive sheet 50 is peeled to the chuck 150 even if the adhesive force of the chuck 150 is weak. In this case, as the pressing means, a long roller rolling ahead of the pressing mechanism can be attached to follow right after the top end 165a of the peeling angle fixing jig 165.

Figure 26A:
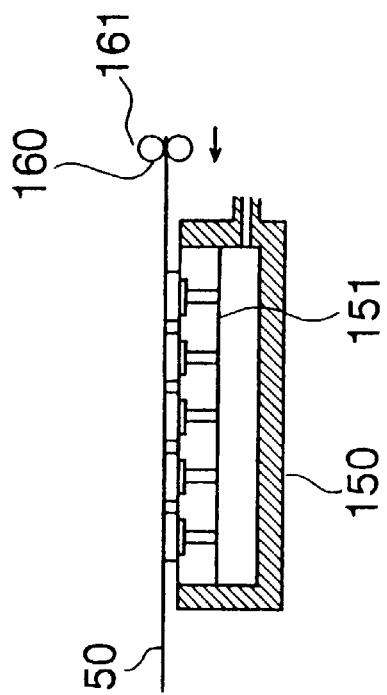
FIGS. 26A to D are a diagram explaining the principle of the separation mechanism part when the part of the adhesive sheet peeled from semiconductor chips in a second embodiment of the whole system is lightly pressed with a rotatable roller.
Figure 26B:
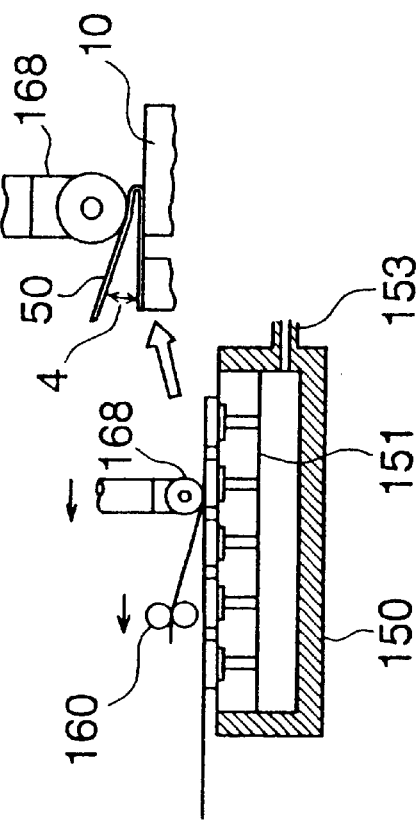
Figure 26C:
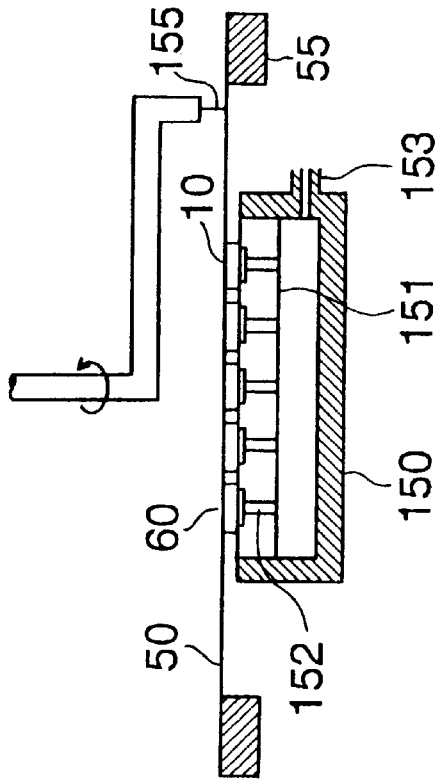
Figure 26D:
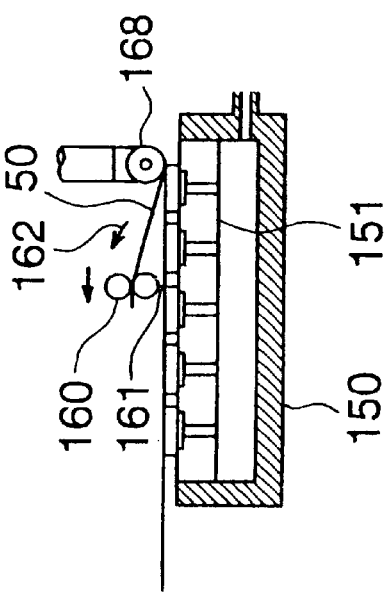

As shown enlarged in FIG. 26D, by lightly pressing the part of the adhesive 50 peeled from the semiconductor chips with a rotatable roller 168, it is possible to form the bending part at a predetermined curved surface as same as to the top end 165a of the peeling angle fixing jig 165, to decrease the angle ψ of the direction in which the pulling force F acts, and increase the peeling force of the adhesive sheet from the semiconductor chips.

Figure 23C:
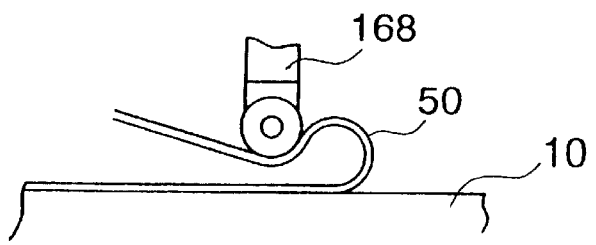

And as shown in FIG. 23C, by controlling a relation between the position of the roller 168, since this case is only for decreasing the angle ψ, the pressing of the rotatable roller 168—and the bending part of the adhesive sheet, and changing the pressing amount of the roller 168, it is obvious that the bending shape of the peeled part of the adhesive tape can be changed. However, in this case it is only for decreasing the angle ψ, it is needed to press lightly with the rotatable roller 168. In addition, it is necessary that a moving speed of the whole clamp means 160 becomes double the speed of rotatable roller 168.

As shown in FIG. 27B, since the number of semiconductor chips adhered to the adhesive sheet are decreasing when approaching a finish of peeling the adhesive sheet for the semiconductor chips held at the chuck 150, a big force to horizontally move the semiconductor chips held at the chuck 150 works as the reaction of the peeling force Fx and the adhesive sheet may not be able to be peeled from a few semiconductor chips. Even if the adhesive sheet is peeled, because of the slippage on the adsorptive surface of the semiconductor chips, the semiconductor chips cannot be picked up or it may touch and crack the peeled chips. Consequently, as shown in FIGS. 27A, C or D, it is necessary to fix the periphery of the adhesive sheet 50 to that of the periphery (frame) of the chuck 150.

Consequently, a vacuum adsorptive hole 156 is provided in the periphery (frame) of the chuck 150 and a needle spicule 157 is provided in the periphery (frame) of the chuck 150. And in a state shown in FIGS. 22B, 25B, and 26B, by pushing the periphery part of the adhesive sheet against the periphery (frame) 159 of the chuck 150 with a pushing up member 169, the adhesive sheet is fixed and bites into the needle spicule 157. And as shown in FIGS. 27C and D, by providing the vacuum adsorptive hole outside the frame of the chuck 150 too, pressing the periphery of the adhesive sheet with the pushing up member slipped outward, and additionally pressing from the side in order to be adsorbed to the vacuum adsorptive hole 158, the periphery of the adhesive sheet 50 can be firmly fixed to the periphery (frame) 159 of the chuck 150. In case when the adhesive sheet can be fixed by the vacuum adsorption, the needle spicle is not needed.

Figure 28:
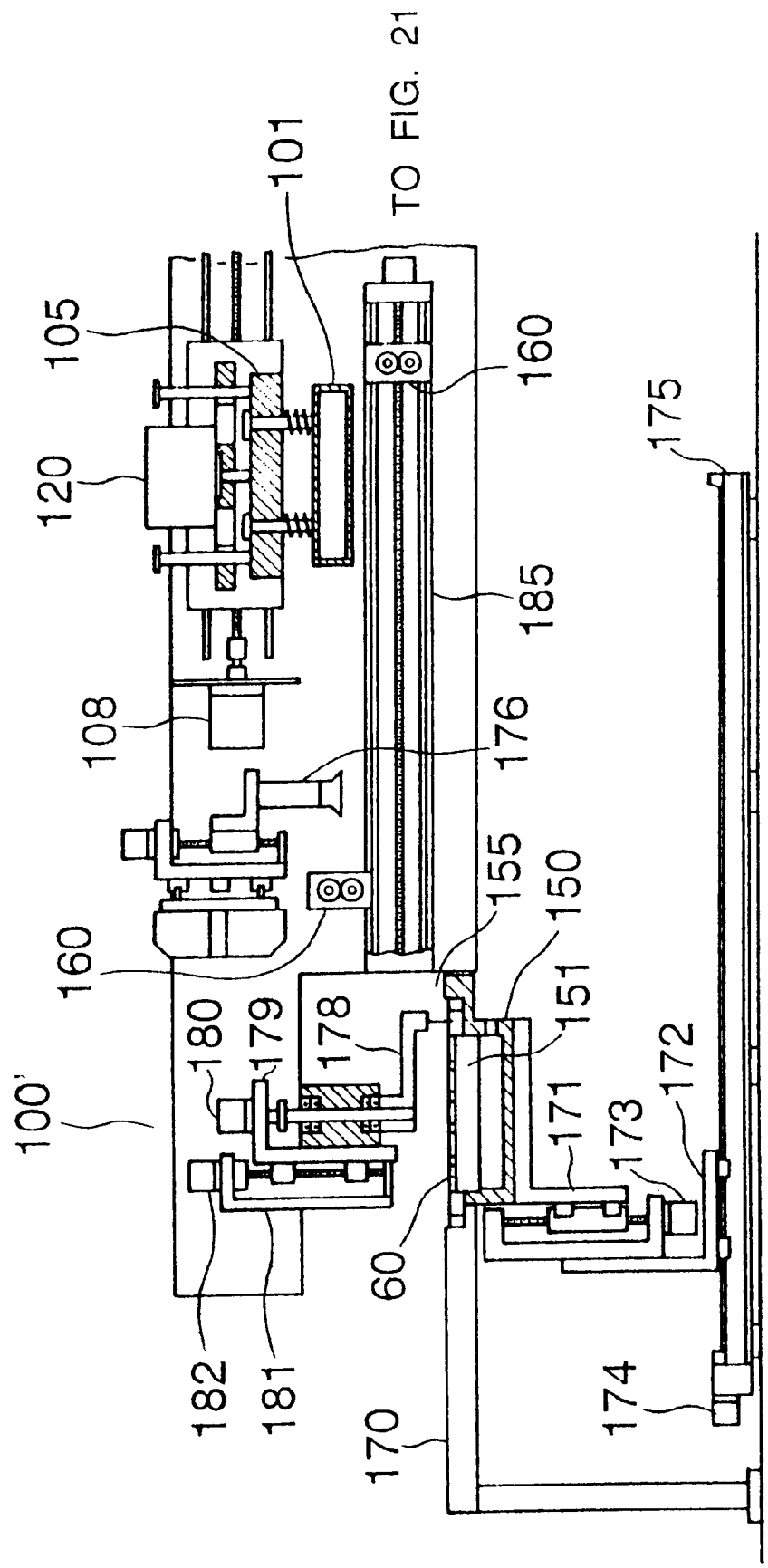
FIG. 28 is a construction diagram of the separation mechanism part in the second embodiment of the whole system for dicing the thin semiconductor wafer into thin semiconductor chips and mounting the semiconductor chips onto the circuit board constructing an IC card or the like according to the invention.

The separation mechanism part (separating means) 100' is constructed as specifically shown in FIG. 28. The work 60 is supplied onto the supporting member 170 with the side of the adhesive sheet 50 facing upward and the metallic frame 55 is positioned and fixed.

The chuck 150 is attached onto the supporting member 171 which is elevated by the drive source 173. The supporting member 171 is supported movably in the vertical direction by a stage 172 which is supported so as to be movable in the lateral direction on a base 175 by feeding operation of a drive source 174.

Consequently, by elevating the chuck 150 to give the chuck force, the chuck 150 strongly holds the whole surface on which the electrode 11 of the semiconductor chip is formed of the work 60 fixed by the supporting member 171. By driving a drive source 182, a supporting member 179 which supports a rotating member 178 to which the cutter 155 is attached is descended. By rotating the rotating member 178 by driving a drive source 180, the metallic frame 55 is diced from the adhesive sheet 50. Reference numeral 181 denotes a member for supporting the supporting member 179 movably in the vertical direction.

The cutter 155 is lifted and the chuck 150 is simultaneously descended by driving the drive source 173 and is moved laterally to the clamp means 160 constructed by the pair of clamps which wait for the chuck 150 by driving the drive source 174. The clamp means 160 comprises a moving mechanism having a drive source for moving the clamp means 160 laterally and a rotating means having a drive source for turning the clamp means 160 by 180°.

As mentioned above, one end of the adhesive sheet 50 is clamped by the clamp means 160, the adhesive sheet 50 is peeled from the group of thin semiconductor chips held by the chuck 150 by a relative operation of the chuck 150 and the clamp means 160, the peeled adhesive sheet is adsorbed by the vacuum means 176 and is removed.

Figure 29:
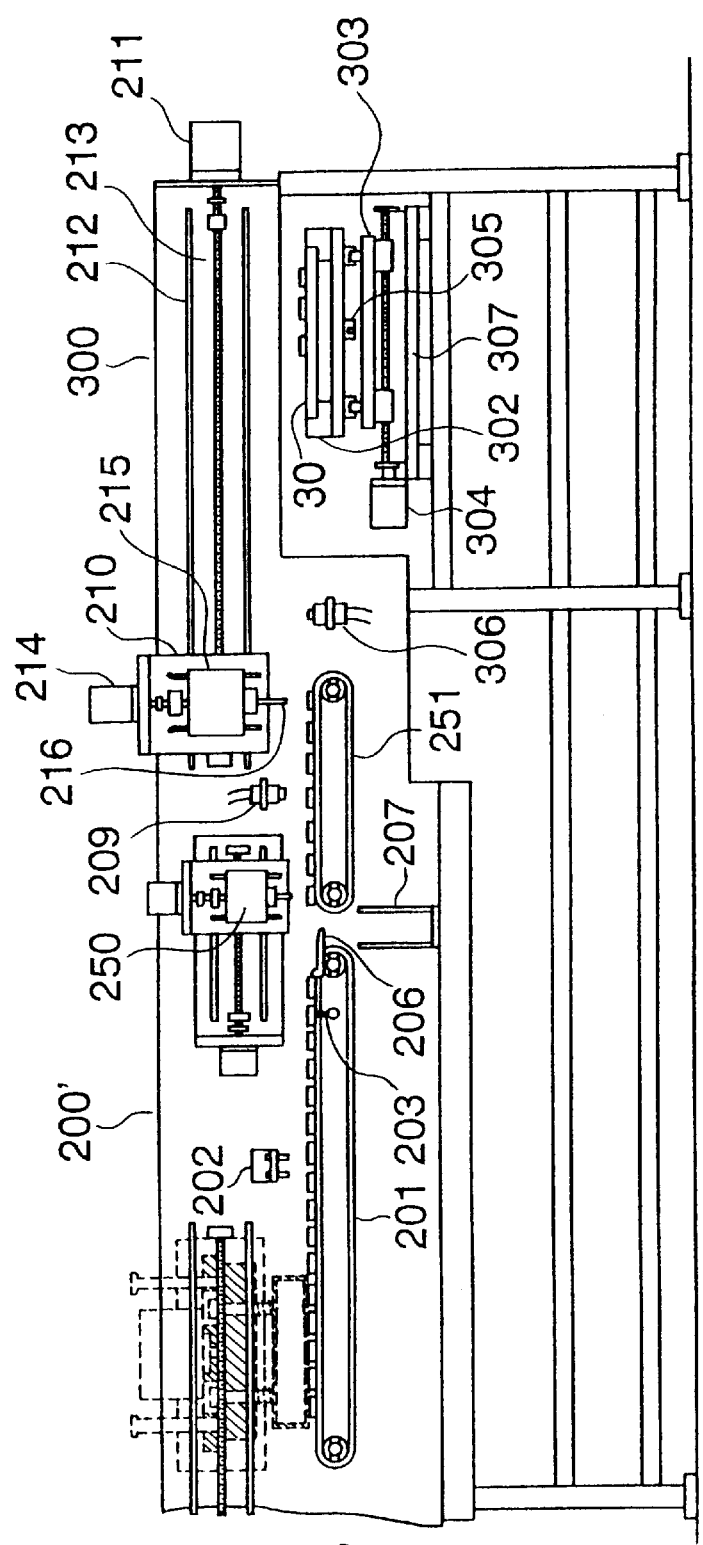
FIG. 29 is a construction diagram showing a separation conveyer part and a mounting mechanism part in the second embodiment of the whole system for dicing the thin semiconductor wafer into thin semiconductor chips and mounting the semiconductor chips onto the circuit board constructing an IC card or the like according to the invention.

The chuck force of the chuck 150 to the group of thin semiconductor chips is weakened, the face opposite to the electrode face is adsorbed by the vacuum collet 101 every group of semiconductor chips of one row and the group of semiconductor chips is put on the conveyer 201 with the electrode face facing downward. In the case of the embodiment as shown in FIG. 29, since the group 20 of thin semiconductor chips is put on the conveyer 201 with the electrode face facing downward in a separation conveyer part (conveying means) 200', the inverting mechanism 208 shown in FIGS. 1 and 16 is unnecessary. Reference numeral 250 is a transfer mechanism for transferring the non-defective semiconductor chips conveyed by the conveyer 201 to the conveyer 251 and aligning the semiconductor chips on the conveyer 251. The mounting mechanism part (mounting means) 300 is similar to that in the first embodiment.

Also in the second embodiment as described above, in a manner similar to the first embodiment, the thin semiconductor wafer is diced into thin semiconductor chips and the thin semiconductor chips can be mounted onto the circuit board which is used to form an IC card or the like at high speed while shortening tact time without cracking or damaging the thin semiconductor chips.

Although in a second embodiment the case in which the separation mechanism 100' arranged in lengthwise is explained, it is required to add a mechanism which can change a direction of the movement from the lengthwise direction to the lateral direction of conveying the vacuum collet 101 in the vacuum collet part 120 comprising the conveyer mechanism as same as in a first embodiment. Thus, in case of the separation mechanism arranged in the lateral direction, the conveying movement shown by a reference numeral 130 of the vacuum collet 101 to the separation conveyer part 200 shown in FIG. 1 needs the lengthwise and the lateral directions. However, the separation mechanism part 100' arranged laterally allows a plurality of the separation mechanism part 100' to be provided in line, and thus it is possible to provide more groups of the semiconductor chips peeled from the adhesive sheet 50 to the separation conveyer part 200'.

In the first and the second embodiments mentioned above, explained is the case of dicing a thin semiconductor wafer in a state where it is adhered to an adhesive sheet into thin semiconductor devices (semiconductor chips), peeling the group of the diced thin semiconductor devices from the adhesive sheet, conveying the group of peeled semiconductor devices in a predetermined unit in serial order, and mounting each semiconductor device to a mounting board (circuit board). However, it is possible to apply in the case of cutting semiconductor devices (electronic components) like a chip size package which are many in row attached with a board or a tape in a state where it is adhered to an adhesive sheet into the semiconductor devices (electronic components) on a unit basis instead of a thin semiconductor wafer, peeling the group of diced semiconductor devices from the adhesive sheet, conveying the group of the peeled semiconductor devices in serial order in a predetermined unit, and mounting each semiconductor device to the mounting board (circuit board). That is, there are various modes as the state of adhering to the adhesive sheet.

Thus, by cutting electronic components in row attached with a board or a tape on a unit basis in a state where they are adhered to an adhesive sheet, peeling the group of cut electronic components from the adhesive sheet by one operation in a state where a mounting surface of the group of the cut electronic components is held by the chuck, it is possible to provide the electronic component to a mounting position at high speed without reversing the electronic component.

The following is the explanation of an embodiment of a method for constructing and fabricating an IC card which is a thin electronic circuit component mounting the above mentioned semiconductor chips to the circuit board.

Figure 30:
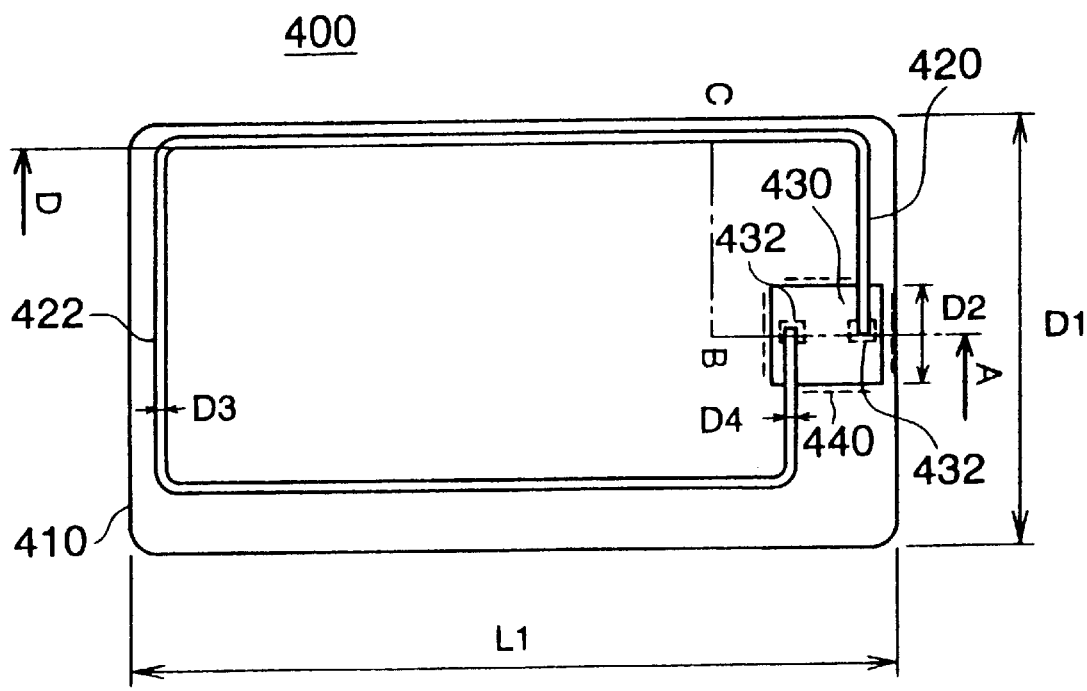
FIG. 30 is a plan view of the IC card according to the invention.
Figure 31:
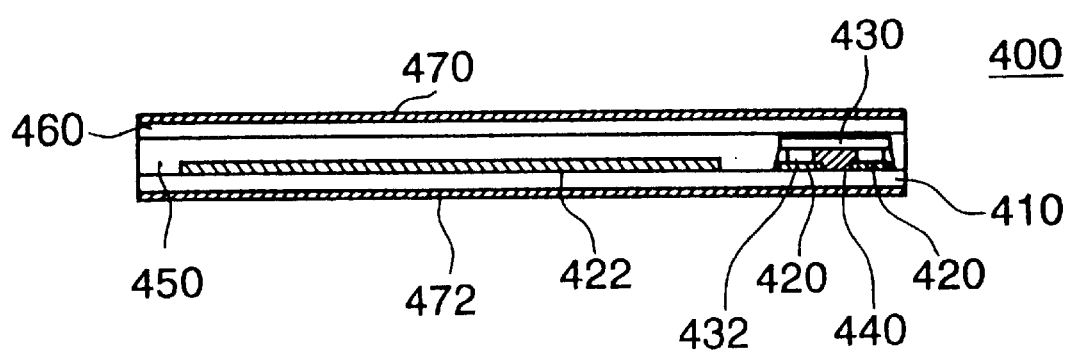
FIG. 31 is an A-B-C-D sectional view of FIG. 31.
Figure 32:
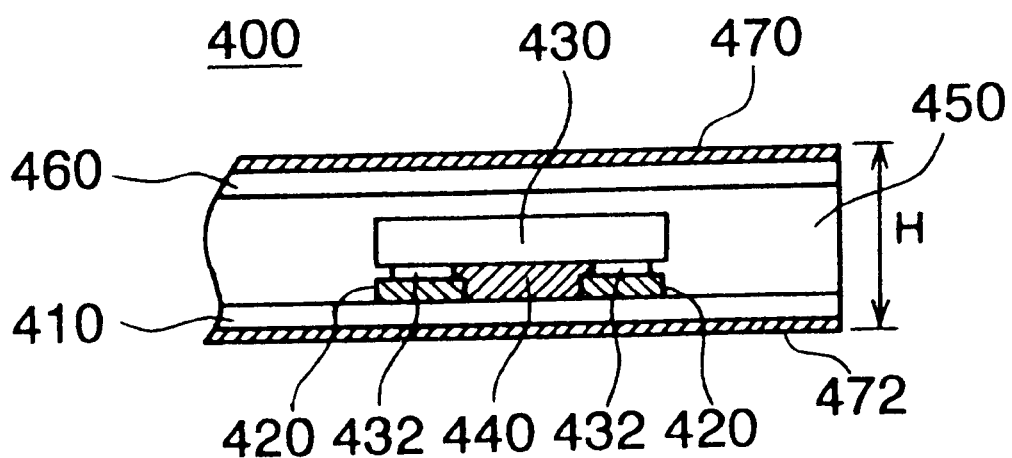
FIG. 32 is an expanded sectional view of the principal part of FIG. 31.

Firstly, a structure of an IC card is explained with reference to FIGS. 30 to 32. FIG. 30 is a plan view of an IC card. FIG. 31 is an A-B-C-D cross sectional view of FIG. 30. FIG. 32 is an enlarged cross sectional view of a principal part of FIG. 31.

As shown in FIG. 30, an IC card 400 comprises a film 410, a conductor pattern 420 formed on and a film 410, and an electronic component 430 such as an IC chip connected to the conductor pattern 420 via an access terminal. A part of the conductor pattern 420 constitutes a loop-shaped antenna coil 422 which is connected to the electronic component 430 (10) by the conductor pattern. The number of winding turns of the loop-shaped antenna is optional. The electronic component 430 is fixed with a temporary fixing fluid 440 against the film 410.

A width D1 and a length L1 of the IC card 400 is 54 mm and 85.6 mm respectively, for example, which are the same with those of a credit card or a telephone card. A square electronic component 430(10), whose width D3 is 3 mm for example is used. A width D3 of the antenna coil 422 and a width D4 of the conductor pattern 420 are 0.2 mm, for example. The access terminal 432 is 15 mm square for example which is shorter than a width of the conductor pattern 420.

A cross sectional structure of the IC card will be explained with reference to FIG. 31. The conductor pattern 420 and the antenna coil 422 are printed on the film 410 of the IC card 400. On the film 410, while the electronic component 430 (10) is fixed with the temporally fixing fluid 440, the access terminal 432 of the electronic component 430 is directly connected to the conductor pattern 420, thereby being electrically continuous. The film 410 and a cover film 460 are laminated and fixed using adhesives like Hot Melt in a state of putting the conductor pattern 420 and the electronic component 430 between. And on the film 410 and the cover film 460, printed surfaces 470 and 470 for a design and the like are printed. From above structure, a thickness H of the IC card 400 is realized to be approximately 0.25 mm thin.

Structural features of such IC card 400 have the following points. That is, a formation of the conductor patterns 420 and 422 by a conductor paste such as Ag and Cu has a single layered structure which is only formed on a single side of the film 410. A method tried presently in which a conductor pattern, especially, an antenna coil is to be formed on both sides of a film can eliminate a screen-printing step for forming a conductor pattern on the single side and a following drying step. In addition, with a single layer structure, the IC card can be thinner to be 0.25 mm in thickness.

Figure 33:
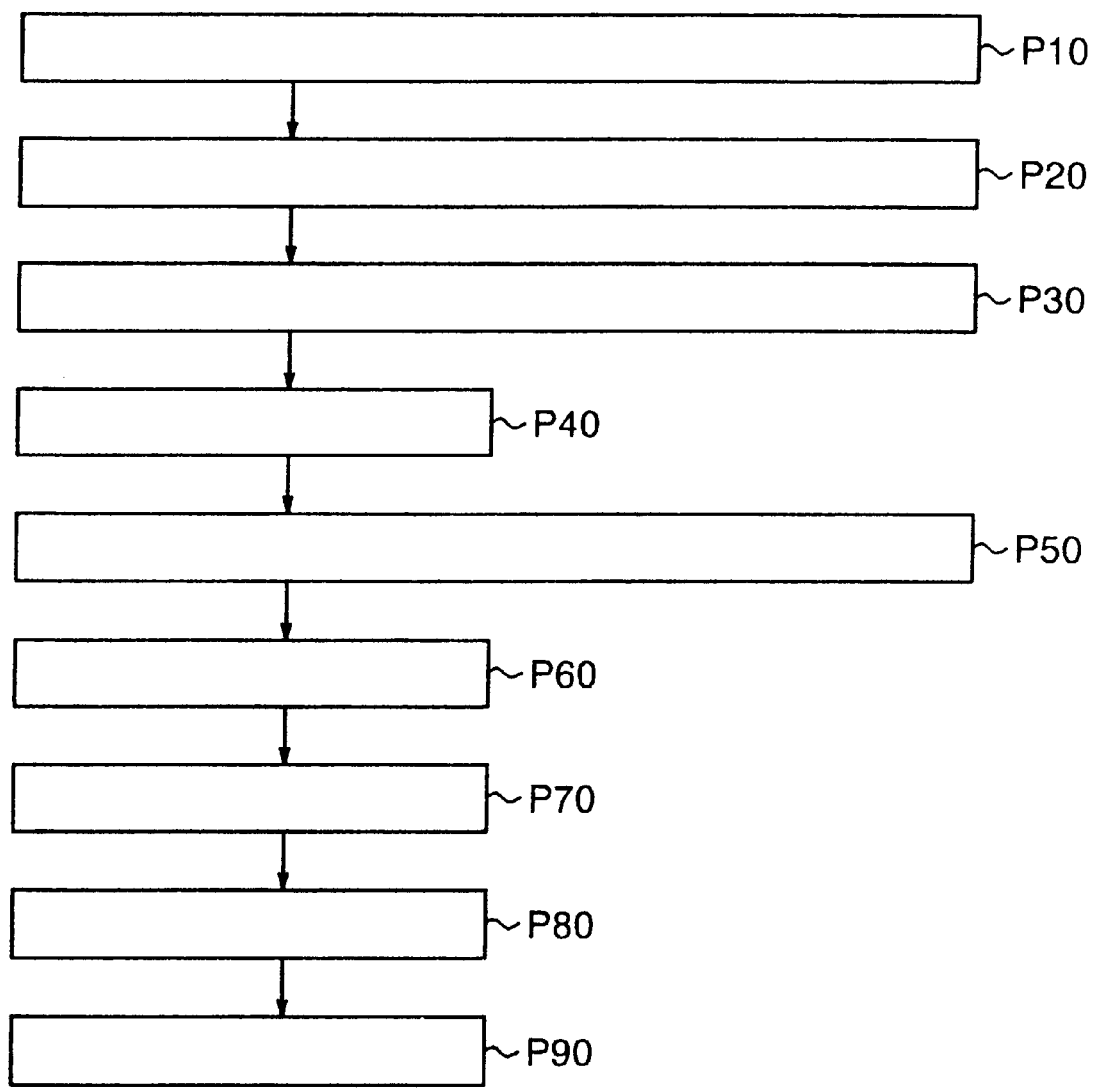
FIG. 33 is a diagram showing the step for fabricating an IC card according to the invention.

A method for fabricating an IC card will be explained with reference to FIG. 33.

A method for fabricating the IC card comprises: a printing step P10 for forming the conductor pattern 420 and the antenna coil 422 on the film 410 by printing in a screen-printing method, for example, with the conductor paste Ag, Cu and the like; a drying step P20 for drying the conductor 420 and the antenna 422 by linearly scanning and irridating a laser beam against the printed conductor pattern 420 and the antenna coil 422, moving the conductor pattern 420 and the antenna coil together with above mentioned film 410 and instantly evaporating the conductor paste; a step P40 for printing or applying a temporally fixing agent 440 to a position to mount the electronic component (10) using a dispenser or the like; a step 50 for laminating by heating/pressing and concurrently connecting electronic component; a cutting step P60 for cutting a sheet laminated in the step P50 into a size of the IC card; a step P70 for printing a design and the like 470 and 472 on both sides; an inspection step P80 for inspecting reading and writing (R/W) against the electronic elements and the like; and a step P90 for cutting an outer shape.

As a material of the film 410, a transparent or white PET (polyethylene terephthalate), PVC (polyvinyl chloride), and plastic such as polyimide are used. The thickness of approximately 75 $\mu$m to 100 $\mu$m, for example is used. A film is provided in the state of roll of 250 mm in width for a system of fabricating the IC card.

A printing step P10 is a step for printing many conductor pattern 420 and the antenna coil 422 on a long yard film 410 corresponding to many IC cards by a screen printing method, for example, using a conductor paste such as Ag, Cu, and the like. The following drying step P20 is a step for heating and drying only the conductor paste such as Ag by using YAG laser of 1.06 $\mu$m in wavelength since a transparent PET film has an absorption range in wavelength of 9 to 10 $\mu$m in case the transparent PET film is used.

As mentioned above, by scanning linearly and irridating an energy beam such as a laser beam and a charge particle beam to the printed conductor pattern 420 and antenna coil 422, and moving the conductor pattern 420 and the antenna coil 422 together with the film 410, a plurality of the arranged conductor pattern 420 and the antenna coil 422 can be dried in short time (a minute or less).

The step P30 is a step for printing and applying a temporally fixing agent 440 to the position for mounting the electronic component 430(10) using a dispenser or the like. A size for applying the agent is the same with or little bigger than the size of the electronic component. As a material of the temporally fixing fluid, a thermoplastic Hot Melt which softens under 100 to 130° C. is used. UV hardening resin can be used instead of Hot Melt.

The mounting step P40 is, as mentioned above, a step for positioning an access terminal 432 of the electronic component 430(10) such as the semiconductor chip and the like which was cut, adsorbed to an adsorption nozzle and conveyed, to a predetermined terminal part of the conductor pattern 420 on a film circuit board as a mounting board 30 mounted on XY stages 302 and 303, and mounting the mentioned electronic component 430 onto the conductor pattern 420. On the film circuit board 410, the electronic component 430 is fixed on the film circuit board by the temporally fixing fluid 440 since the temporally fixing fluid 440 has been applied in the step P30. The access terminal 432 of the electronic component 420 is formed by the ball bonding and the part other than the electronic component 420 is processed insulation with a polyimide.

Figure 34:
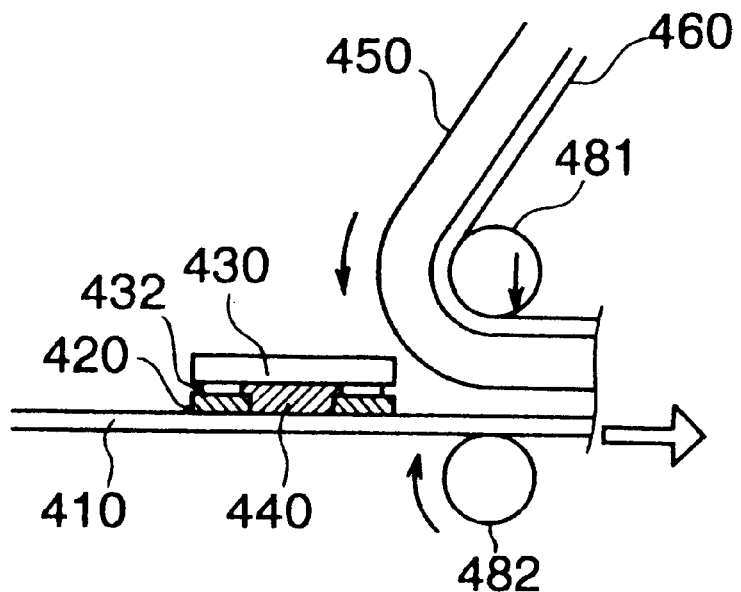
FIG. 34 is a diagram explaining a step of laminating (heating/pressing) and connecting electronic component concurrently.
Figure 35:
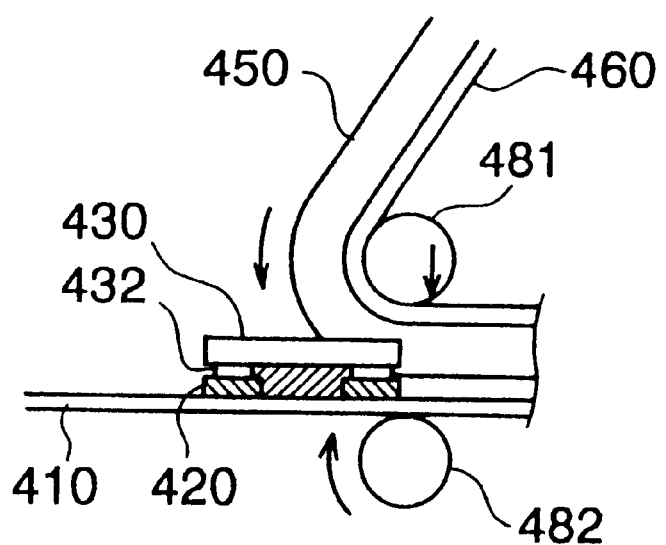
FIG. 35 is a diagram explaining a step of laminating (heating/pressing) and connecting an electronic component concurrently.

The step P50 for laminating by heating/pressing and concurrently connecting electronic components will be explained in the following with reference to FIGS. 34 and 35. As shown in FIG. 34, the cover film 460 uses the same material having the same thickness with the film 410. That is, the cover film 460 uses a transparent or white PET (polyethylene terephthalate), the thickness of which is approximately 75 μm to 100 μm. On a side of the cover film the adhesion 450 which has the thickness of about 80 μm, for example is pre-laminated. Hot Melt is used here as a material of the adhesive 450. Adhesives other than Hot Melt can be used.

A step P50 is a step for putting the film 410 mounted the electronic component 430 (10) and the cover film 460 laminated the adhesive 450 between the hot rolls 481 and 482, and laminating the film 410 and the cover film 460 by the hot rolls 481 and 482. The hot rolls 481 and 482 use steel rolls thereby leveling films at the time of laminating.

As shown in FIG. 34, here concurrently the access terminal 432 of the electronic 430 joins and electrically connects the conductors by engaging into the conductor pattern 420 while eliminating to the temporally fixing fluid 440. By setting a laminating pressure to be 20 kgf/cm$^2$, and a heating energy to be 130° C. for example, it is possible to laminate the film 410 and the cover film and connect the access terminal 432 of the electronic component 430 and the conductor pattern 420 at the same time.

In comparison with a case in which an anisotropic conductive adhesive is used for instance, the use of the temporally fixing fluid 440 like Hot Melt as the adhesive agent for temporally fixing the electronic component 430 allows the lower material cost, the connection of the electronic component in a shorter time, and the advantage not requiring a higher mounting accuracy for the electronic components. Besides the method by hot rolls, it is possible to use a flat press for laminating.

By cutting the sheet laminated into a size of an IC card in the cutting step P60, printing a design and the like 470 and 472 on both sides in the step P70, transmitting electricity by a radio to the antenna 433 by a communication inspection equipment, sending and receiving data by a radio, testing reading and writing of electronic components and the like in the inspection step P80, and cutting off an external shape in the step 90, the IC card 400 is completed.

In the above embodiment, the case is explained in which the conductor patterns 420 and 422 are formed by a screen-printing of the conductor paste. But the conductor patterns 420 and 422 also can be formed by etching or wires. In that case, low-melting solder of Sn/Bi families for example (melting point: 100–150° C.) or an In alloy layer having a low melting point shall be formed on the conductor pattern 420. On the other hand, by Au-plating the surface of the access terminal 432 formed by boll bonding of the electronic component 430, it is possible to have favorable joint and connection between the access terminal 432 and the conductor pattern 420 by the heating/pressing step P50. As a matter of course, if the ball bonding is Au, Au-plating is not necessary.

As mentioned, it is possible to fabricate the thin IC card 400 efficiently with low cost.

According to the invention, there is an effect such that a thin semiconductor wafer having the thickness of about 0.002 to 0.2 mm in a state where it is adhered to an adhesive sheet is diced into thin semiconductor devices (semiconductor chips), the group of diced thin semiconductor devices is peeled from the adhesive sheet at high speed without damaging or cracking the semiconductor devices, and the group of peeled semiconductor devices is conveyed in serial order in a predetermined unit. The semiconductor devices can be mounted on a mounting board (circuit board). Consequently, a high-quality thin product such as an IC card can be manufactured.

According to the invention, there is an effect such that a thin semiconductor wafer having the thickness of about 0.002 to 0.2 mm in a state where it is adhered to an adhesive sheet is diced into thin semiconductor devices (semiconductor chips), the group of diced thin semiconductor devices is peeled from the adhesive sheet at high speed without being damaged or cracked, and can be separated from the adhesive sheet.

According to the invention, there is an effect such that electronic devices in a state where they are adhered to an adhesive sheet are cut on a unit basis, the group of the cut electronic devices is peeled from the adhesive sheet at high speed without damaging or cracking each electronic device and separated by the vacuum collet. The electronic devices can be mounted on a mounting board (circuit board). Consequently, a high-quality product can be fabricated.

According to the invention, there is an effect such that a high-quality thin IC card can be fabricated efficiently at low cost.

What is claimed is:

1. A semiconductor device separating apparatus for peeling off a group of semiconductor devices in a row, among semiconductor devices for an object obtained by dicing a semiconductor wafer adhered to a front face of an adhesive sheet, in such a manner that a member having a tip in a projecting or curved shape is pushed up against the back face of said adhesive sheet to thereby give tension to said adhesive sheet, and said member, while pushed up against the back face, is moved from one end to the other end of the adhesive sheet so as to peel off the group of semiconductor devices in the row, said device further comprising a pressure sensor for sensing the pressure pushing up against the back of the adhesive sheet.

2. A semiconductor device separating apparatus according to claim 1, wherein said member is adapted to push up against the back face of the adhesive sheet such that a tension acting on the adhesive sheet is less than the elastic limit thereof.

* * * * *